(12) United States Patent
Ricks et al.

(10) Patent No.: US 7,192,659 B2
(45) Date of Patent: Mar. 20, 2007

(54) OLED DEVICE USING REDUCED DRIVE VOLTAGE

(75) Inventors: Michele L. Ricks, Rochester, NY (US); Tukaram K. Hatwar, Penfield, NY (US); Jeffrey P. Spindler, Rochester, NY (US); Michael L. Boroson, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 366 days.

(21) Appl. No.: 10/824,086

(22) Filed: Apr. 14, 2004

(65) Prior Publication Data

US 2005/0233166 A1    Oct. 20, 2005

(51) Int. Cl.
*H01L 51/50* (2006.01)
*H05B 33/14* (2006.01)

(52) U.S. Cl. ............... 428/690; 428/917; 313/504; 313/506; 313/112; 257/98

(58) Field of Classification Search ............... 428/690, 428/917; 313/504, 506, 112; 257/98
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,405,709 A | 4/1995 | Littman et al. | |
| 5,683,823 A | 11/1997 | Shi et al. | |
| 6,013,384 A | 1/2000 | Kido et al. | |
| 6,392,340 B2 | 5/2002 | Yoneda et al. | |
| 6,509,109 B1 | 1/2003 | Nakamura et al. | |
| 2001/0043043 A1 | 11/2001 | Aoyama et al. | |
| 2003/0044640 A1 | 3/2003 | Funahashi et al. | |
| 2003/0077480 A1 | 4/2003 | Hosokawa et al. | |

FOREIGN PATENT DOCUMENTS

| | | |
|---|---|---|
| EP | 1 182 183 | 2/2002 |
| EP | 1 182 244 | 2/2002 |
| EP | 1 286 569 | 2/2003 |
| JP | 7-142169 | 6/1995 |

OTHER PUBLICATIONS

Kido et al., Science, 267, 1332 (1995).
Kido et al., Applied Physics Letters, 64, 815 (1994).
Deshpande et al., Applied Physics Letters, 75, 888 (1999).
Kido et al., "Bright Organic Electroluminescent Devices Having a Metal-Doped Electron-Injecting Layer", Applied Physics Letters, 73, 2866 (1998).
Haskal et al. in "Lithium-Aluminum Contacts for Organic Light-Emitting Devices", Applied Physics Letters, 71, 1151 (1997).

*Primary Examiner*—Dawn Garrett
(74) *Attorney, Agent, or Firm*—Raymond L. Owens

(57) ABSTRACT

An OLED device includes an anode, a first light-emitting layer disposed over the anode, and a second light-emitting layer disposed over the first light-emitting layer. The device also includes a metal-doped organic layer containing an organic electron-transporting material and a low work function metal disposed over the second light-emitting layer, and a cathode disposed over the metal-doped organic layer.

37 Claims, 2 Drawing Sheets

OLED DEVICE USING REDUCED DRIVE VOLTAGE

CROSS REFERENCE TO RELATED APPLICATIONS

Reference is made to commonly assigned U.S. patent application Ser. No. 10/713,523 filed Nov. 14, 2003 by Liang-Sheng Liao et al., entitled "Organic Electroluminescent Devices Having a Stability-Enhancing Layer", the disclosure of which is herein incorporated by reference.

FIELD OF THE INVENTION

The present invention relates to reducing drive voltages for organic electroluminescent (EL) devices, also known as organic light-emitting diodes (OLED) that emit color light.

BACKGROUND OF THE INVENTION

An organic light-emitting diode device, also called an OLED device, commonly includes a substrate, an anode, a hole-transporting layer made of an organic compound, an organic luminescent layer with suitable dopants, an organic electron-transporting layer, and a cathode. OLED devices are attractive because of their low driving voltage, high luminance, wide-angle viewing and capability for full-color flat emission displays. Tang et al. described this multilayer OLED device in their U.S. Pat. Nos. 4,769,292 and 4,885,211.

A white-emitting electroluminescent (EL) layer can be used to form a multicolor device. Each pixel is coupled with a color filter element as part of a color filter array (CFA) to achieve a pixilated multicolor display. The organic EL layer is common to all pixels and the final color as perceived by the viewer is dictated by that pixel's corresponding color filter element. Therefore, a multicolor or RGB device can be produced without requiring any patterning of the organic EL layers. An example of a white CFA top-emitting device is shown in U.S. Pat. No. 6,392,340.

White light producing OLED devices should be bright, efficient, and generally have Commission International d'Eclairage (CIE) chromaticity coordinates of about (0.33, 0.33). The following patents and publications disclose the preparation of organic OLED devices capable of producing white light, comprising a hole-transporting layer and an organic luminescent layer, and interposed between a pair of electrodes.

White light producing OLED devices have been reported by J. Shi (U.S. Pat. No. 5,683,823) wherein the luminescent layer includes red and blue light-emitting materials uniformly dispersed in a host-emitting material. Sato et al. in JP 07-142169 disclose an OLED device, capable of emitting white light, made by forming a blue light-emitting layer next to the hole-transporting layer and followed by a green light-emitting layer having a region containing a red fluorescent layer.

Kido et al., in *Science*, 267, 1332 (1995) and in *Applied Physics Letters*, 64, 815 (1994), report a white light-producing OLED device. In this device, three emitter layers with different carrier transport properties, each emitting blue, green, or red light, are used to produce white light. Littman et al., in U.S. Pat. No. 5,405,709, disclose another white emitting device, which is capable of emitting white light in response to hole-electron recombination, and comprises a fluorescent in a visible light range from bluish green to red. More recently, Deshpande et al., in *Applied Physics Letters*, 75, 888 (1999), published a white OLED device using red, blue, and green luminescent layers separated by a hole-blocking layer.

As is known, low work function metals can be used to dope into an electron-injecting layer (EIL), which is adjacent to a cathode to improve electron-injection and transport in an OLED. For example, Kido et al. reported in "Bright Organic Electroluminescent Devices Having a Metal-Doped Electron-Injecting Layer", *Applied Physics Letters*, 73, 2866 (1998) and disclosed in U.S. Pat. No. 6,013,384 that an OLED can be fabricated containing a low work function metal-doped electron-injecting layer adjacent to a cathode. These OLEDs, containing a lithium (Li)-doped electron-injecting layer, exhibit high luminous efficiency and low drive voltage. However, Li and other metals are reported as being diffusive in organic layers resulting in luminescence quenching in OLEDs, for example, as reported by Haskal et al. in "Lithium-Aluminum Contacts for Organic Light-Emitting Devices", *Applied Physics Letters*, 71, 1151 (1997). An OLED containing a Li-doped tris(8-hydroxyquinoline)aluminum (Alq) layer would also face the problems of luminescence quenching and lifetime shortening, as discussed by Nakamura et al. in U.S. Pat. No. 6,509,109.

Despite these advances, there is a continuing need for reduction in drive voltage to enable low power consumption for making OLED devices. Operational stability and luminous efficiency of OLED devices must be maintained to permit their use in more products.

SUMMARY OF THE INVENTION

It is therefore an object of the present invention to reduce the drive voltage of an OLED device, while maintaining the acceptable colors of light emission.

It is another object to provide an OLED device that operates with low drive voltage, and has effective luminous efficiency and operational stability.

It has been discovered, quite unexpectedly, that by incorporating a second light-emitting layer into the OLED device and disposing an electron transporting material doped with a low work function metal over the second light-emitting layer, a low voltage OLED has been achieved with the desired color of light emission, while maintaining effective luminous efficiency and operational stability.

These objects are achieved by an OLED device comprising:

a) an anode;

b) a first light-emitting layer disposed over the anode;

c) a second light-emitting layer disposed over the first light-emitting layer;

d) a metal-doped organic layer containing an organic electron-transporting material and a low work function metal disposed over the second light-emitting layer; and e) a cathode disposed over the metal-doped organic layer.

ADVANTAGES

It is an advantage of this invention that the drive voltage of the OLED can be reduced, while maintaining the desired color of light emission. It is a further advantage that an OLED device made in accordance with this invention has high luminous efficiency and high operational stability. It is a further advantage that the color of light emission can be tuned to achieve a desired color.

Since device feature dimensions including layer thicknesses are frequently in sub-micrometer ranges, the drawings are scaled for ease of visualization rather than dimensional accuracy.

DETAILED DESCRIPTION OF THE INVENTION

The term "pixel" is employed in its art-recognized usage to designate an area of a display panel that can be stimulated to emit light independently of other areas. The term "OLED device" or "organic light-emitting display" is used in its art-recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be produced by appropriate mixing. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel and subpixel. The term "subpixel" is used in multicolor display panels and is employed to designate any portion of a pixel, which can be independently addressable to emit a specific color. For example, a blue subpixel is that portion of a pixel which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

In accordance with this disclosure, broadband emission is light that has significant components in multiple portions of the visible spectrum, for example, blue and green. Broadband emission can also include the situation where light is emitted in the red, green, and blue portions of the spectrum in order to produce white light. White light is that light that is perceived by a user as having a white color, or light that has an emission spectrum sufficient to be used in combination with color filters to produce a multicolor or full color display. Although CIEx, CIEy coordinates of about 0.33, 0.33 can be ideal in some circumstances, the actual coordinates can vary significantly and still be very useful.

Figure 1:
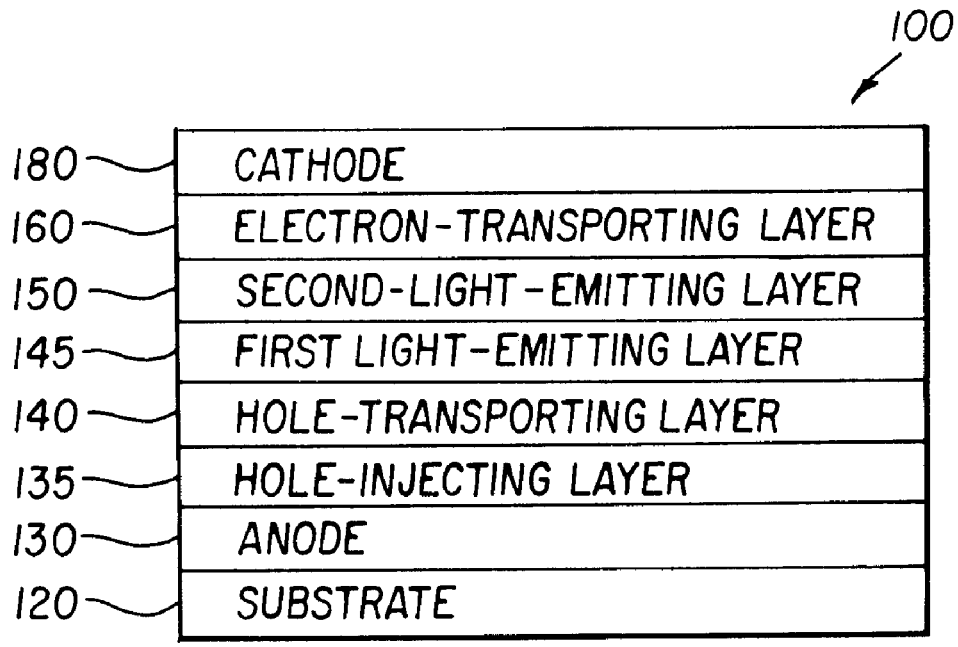
FIG. 1 shows a cross-sectional view of a prior art OLED device.

Turning now to FIG. 1, there is shown a cross-sectional view of a pixel of a prior art broadband emitting OLED device 100 that can be incorporated into a display or an area lighting system. The OLED device 100 includes a substrate 120, an anode 130, a cathode 180 spaced from anode 130, a first light-emitting layer 145, and a second light-emitting layer 150. The first and second light-emitting layers emit different color light. If white light emission is desired, the first and second light-emitting layers typically emit complementary, or nearly complementary, colors. The combination of light emission between the two light-emitting layers should cover most of the visible spectrum in order to produce useful white light. For example, the first light-emitting layer can emit yellow and the second light-emitting layer can emit blue. The prior art device can also have other layers including a hole-injecting layer (HIL) 135, a hole-transporting layer (HTL) 140, and an electron-transporting layer (ETL) 160. Although the addition of an ETL can improve the efficiency of light emission in terms of cd/A, the ETL increases the drive voltage.

Figure 2:
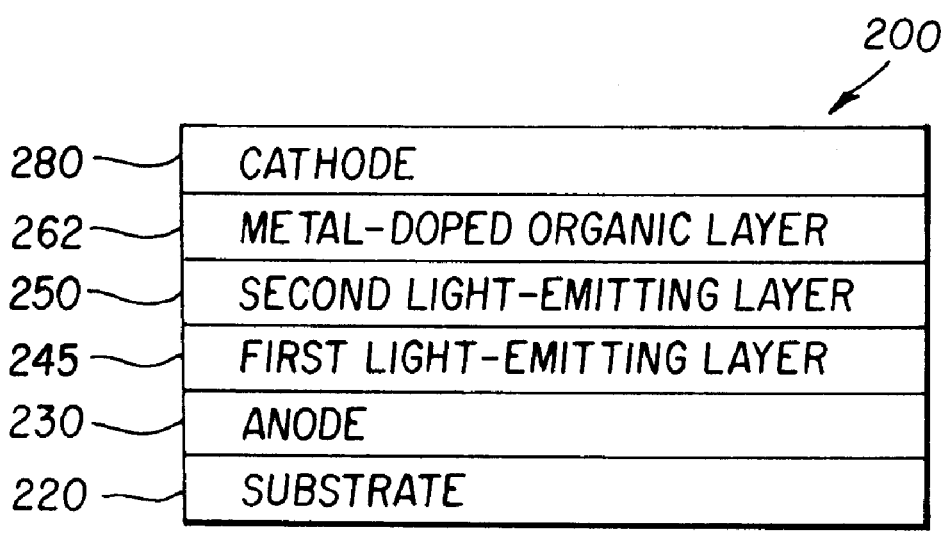
FIG. 2 shows a cross-sectional view of one embodiment of an OLED device in accordance with this invention.

Turning now to FIG. 2, there is shown a cross-sectional view of a pixel of a broadband emitting OLED device 200 according to a first embodiment of the present invention. Such an OLED device can be incorporated into, for example, a display or an area lighting system. The OLED device 200 includes a substrate 220, an anode 230, a cathode 280 spaced from anode 230, a first light-emitting layer 245, a second light-emitting layer 250, and a metal-doped organic layer 262. The thickness of the second light-emitting layer is preferably from 5 to 20 nm, and can be selected to optimize the desired color of light emitted from the OLED device.

The metal-doped organic layer 262 contains an organic electron-transporting material and a low work function metal (<4.0 eV). Suitable metals for the metal-doped organic layer 262 include alkali metals (e.g. lithium, sodium), alkaline earth metals (e.g. barium, magnesium), metals from the lanthanide group (e.g. lanthanum, neodymium, lutetium), or combinations thereof. The concentration of the low work function metal in the metal-doped organic layer 262 is in the range of from 0.1% to 30% by volume. Preferably, the concentration of the low work function metal in the metal-doped organic layer 262 is in the range of from 0.2% to 10% by volume. Preferably, the low work function metal is provided in a mole ratio in a range of from 1:1 with the organic electron transporting material.

Suitable organic electron transporting materials for use in the metal-doped organic layer are materials that can be used in an organic electron-transporting layer as known in the art. Conveniently, the organic electron-transporting material is a metal oxinoid material, for example, as defined by formula E (below), or a phenanthroline derivative, including bathocuproin. Two or more different organic electron-transporting materials can be codeposited. Low work function metals can be deposited by any suitable means including thermal evaporation, electron-beam evaporation, ion sputtering, or other film fabrication methods. In order to be compatible with the codeposition of the organic electron-transporting material, the low work function metal is preferably deposited by thermal evaporation. To simplify manufacturing, the electron-transporting material in the metal-doped organic layer 262 can be the same as the host material in the second light-emitting layer 250.

Figure 3:
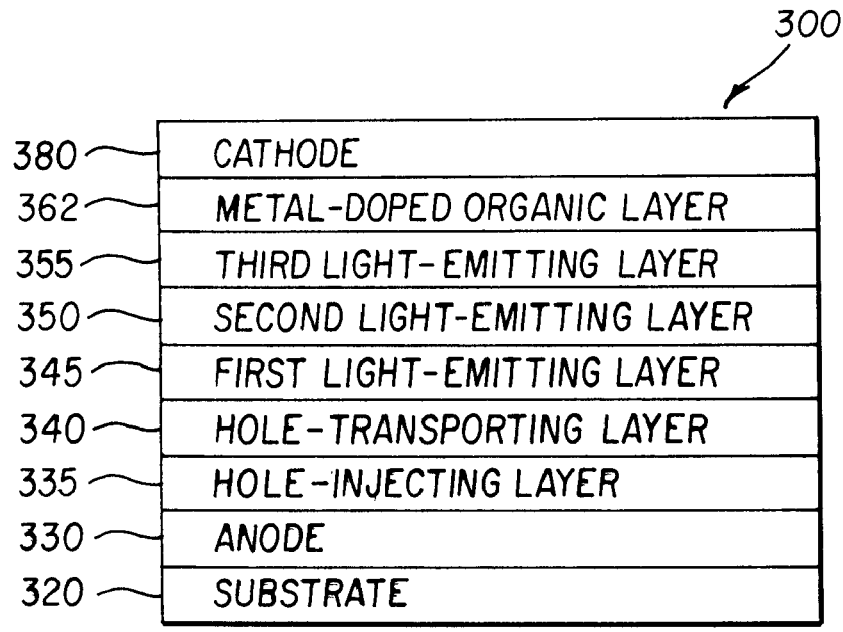
FIG. 3 shows a cross-sectional view of another embodiment of an OLED device in accordance with this invention.

Turning now to FIG. 3, there is shown a cross-sectional view of a pixel of a white OLED device 300 that can be used according to an embodiment of this invention. Such an OLED device can be incorporated into a display or an area lighting system. The OLED device 300 includes a substrate 320, an anode 330, a cathode 380 spaced from anode 330, a hole-injecting layer 335, a hole-transporting layer 340, a first light-emitting layer 345, a second light-emitting layer 350, a third light-emitting layer 355, and a metal-doped organic layer 362 disposed over the third light-emitting layer. The metal-doped organic layer 362 is defined as above for metal-doped organic layer 262. The three light-emitting layers emit different colors in order to produce white light. Although the particular colors emitted by each layer are not limited in a useful embodiment, the first light-emitting layer 345 emits yellow, orange, or red light, the second light-emitting layer 350 emits blue or blue-green light, and the third light-emitting layer 355 emits green light. The color of the light emitted from the OLED device can be further tuned by the thickness and composition of the third light-emitting layer 355.

The present invention can be employed in most OLED device configurations. These include very simple structures comprising a single anode and cathode to more complex devices, including passive-matrix displays comprised of orthogonal arrays of anodes and cathodes to form pixels, and active-matrix displays where each pixel is controlled independently, for example, with thin film transistors (TFTs). OLED devices of this invention can operate under forward biasing and so can function under DC mode. It is sometimes advantageous to apply a reverse bias in an alternating mode. The OLED typically does not emit light under reverse bias, but significant stability enhancements have been demonstrated, as described in U.S. Pat. No. 5,552,678.

The substrate on which the OLED is fabricated, as in substrate 320, can be an organic solid, an inorganic solid, or can include organic and inorganic solids. The substrate can be rigid or flexible and can be processed as separate individual pieces, including sheets or wafers, or as a continuous roll. Typical substrate materials include glass, plastic, metal, metal foil, ceramic, semiconductor, metal oxide, semiconductor oxide, semiconductor nitride, or combinations thereof. The substrate can be a homogeneous mixture of materials, a composite of materials, or multiple layers of materials. Substrate 20 can be an OLED substrate, that is a substrate commonly used for preparing OLED devices, e.g., active-matrix low-temperature polysilicon or amorphous-silicon TFT substrate. The substrate 20 can either be light transmissive or opaque, depending on the intended direction of light emission. The light transmissive property is desirable for viewing the EL emission through the substrate. Transparent glass or plastic are commonly employed in such cases. For applications where the EL emission is viewed through the top electrode, the transmissive characteristic of the bottom support is immaterial, and therefore can be light transmissive, light absorbing, or light reflective. Substrates for use in this invention include, but are not limited to, glass, plastic, semiconductor materials, ceramics, and circuit board materials, or any others commonly used in the formation of OLED devices, which can be either passive-matrix devices or active-matrix devices.

A first electrode is formed over the substrate and is most commonly configured as an anode, e.g. as in anode 330. However, the OLED devices of this invention are not limited to this configuration, and can instead be have a cathode as the first electrode. For the purposes of this discussion, the electrode adjacent to the substrate is considered the anode. When EL emission is viewed through the substrate, the anode should be transparent, or substantially transparent, to the emission of interest. Common transparent anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides including gallium nitride, metal selenides including zinc selenide, and metal sulfides including zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to silver, gold, iridium, molybdenum, palladium, and platinum. The preferred anode materials, transmissive or otherwise, have a work function of 4.1 eV or greater. If necessary, the work function of the anode surface can be altered by chemical or plasma treatments. Desired anode materials can be deposited by any suitable ways including evaporation, sputtering, chemical vapor deposition, or electrochemical means. Anode materials can be patterned using well known photolithographic processes.

When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<3.0 eV) or metal alloy. One preferred cathode material is comprised of a Mg:Ag alloy wherein the percentage of silver is in the range of from 1 to 20%, as described in U.S. Pat. No. 4,885,221. Li:Al alloys are also useful cathode materials. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861, 5,059,862, and 6,140,763.

When light emission is viewed through the cathode, it should be transparent or nearly transparent. For such applications, metals must be thin or one must use transparent conductive oxides, including these materials. Optically transparent cathodes have been described in more detail in U.S. Pat. Nos. 5,776,623 and 6,548,956. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

In another embodiment of the present invention, the OLED device has a microcavity structure. In this case, one of the metallic electrodes is essentially opaque and reflective, the other one is reflective and semitransparent. The reflective electrode is preferably selected from Au, Ag, Mg, Ca, or alloys thereof. Because of the presence of the two reflecting metal electrodes, the device has a microcavity structure. The strong optical interference in this structure results in a resonance condition. Emission near the resonance wavelength is enhanced and emission away from the resonance wavelength is depressed. The optical path length can be tuned by selecting the thickness of the organic layers or by placing a transparent optical spacer between the electrodes. For example, an OLED device of this invention can have an ITO spacer layer placed between a reflective anode and the organic EL media, with a semitransparent cathode over the organic EL media.

While not always necessary, it is often useful that a hole-injecting layer be formed over the anode in an organic light-emitting display. The hole-injecting material can serve to improve the film formation property of subsequent organic layers and to facilitate injection of holes into the hole-transporting layer. Suitable materials for use in hole-injecting layer include, but are not limited to, porphyrinic compounds as described in U.S. Pat. No. 4,720,432, plasma-deposited fluorocarbon polymers as described in U.S. Pat. No. 6,208,075, and inorganic oxides including vanadium oxide (VOx), molybdenum oxide (MoOx), nickel oxide (NiOx), etc. Alternative hole-injecting materials reportedly useful in organic EL devices are described in EP 0 891 121 A1 and EP 1 029 909 A1.

While not always necessary, it is often useful that a hole-transporting layer be formed and disposed over the anode or over the hole-injecting layer. Desired hole-transporting materials can be deposited by any suitable way including evaporation, sputtering, chemical vapor deposition, electrochemical means, thermal transfer, or laser thermal transfer from a donor material. Useful hole-transporting materials include aromatic tertiary amines, where the latter is understood to be a compound containing at least one trivalent nitrogen atom that is bonded only to carbon atoms, at least one of which is a member of an aromatic ring. In one form the aromatic tertiary amine can be an arylamine, including a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen-containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Such compounds include those represented by structural Formula A

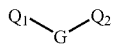

A wherein:

$Q_1$ and $Q_2$ are independently selected aromatic tertiary amine moieties; and G is a linking group including an arylene, cycloalkylene, or alkylene group of a carbon to carbon bond.

In one embodiment, at least one of $Q_1$ or $Q_2$ contains a polycyclic fused ring structure, e.g. a naphthalene. When G is an aryl group, it is conveniently a phenylene, biphenylene, or naphthalene moiety.

A useful class of triarylamines satisfying structural Formula A and containing two triarylamine moieties is represented by structural Formula B

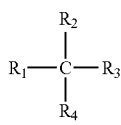

B where:

$R_1$ and $R_2$ each independently represent a hydrogen atom, an aryl group, or an alkyl group, or $R_1$ and $R_2$ together represent the atoms completing a cycloalkyl group; and $R_3$ and $R_4$ each independently represent an aryl group, which is in turn substituted with a diaryl substituted amino group, as indicated by structural Formula C

C wherein $R_5$ and $R_6$ are independently selected aryl groups. In one embodiment, at least one of $R_5$ or $R_6$ contains a polycyclic fused ring structure, e.g. a naphthalene.

Another class of aromatic tertiary amines are the tetraaryldiamines. Desirable tetraaryldiamines include two diarylamino groups, such as indicated by Formula C, linked through an arylene group. Useful tetraaryldiamines include those represented by Formula D

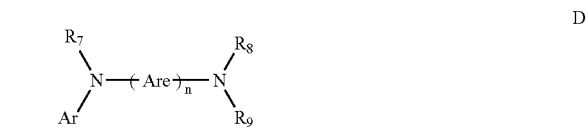

D wherein:

each Are is an independently selected arylene group, including a phenylene or anthracene moiety;

n is an integer of from 1 to 4; and

Ar, $R_7$, $R_8$, and $R_9$ are independently selected aryl groups.

In a typical embodiment, at least one of Ar, $R_7$, $R_8$, and $R_9$ is a polycyclic fused ring structure, e.g. a naphthalene.

The various alkyl, alkylene, aryl, and arylene moieties of the foregoing structural Formulae A, B, C, D, can each in turn be substituted. Typical substituents include alkyl groups, alkoxy groups, aryl groups, aryloxy groups, and halogens including fluoride, chloride, and bromide. The various alkyl and alkylene moieties typically contain from 1 to about 6 carbon atoms. The cycloalkyl moieties can contain from 3 to about 10 carbon atoms, but typically contain 5, 6, or 7 carbon atoms, e.g. cyclopentyl, cyclohexyl, and cycloheptyl ring structures. The aryl and arylene moieties are usually phenyl and phenylene moieties.

The hole-transporting layer in an OLED device can be formed of a single or a mixture of aromatic tertiary amine compounds. Specifically, one can employ a triarylamine, including a triarylamine satisfying the Formula B, in combination with a tetraaryldiamine, including that indicated by Formula D. When a triarylamine is employed in combination with a tetraaryldiamine, the latter often is positioned as a layer interposed between the triarylamine and the electron-injecting and transporting layer. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
N,N,N',N'-tetraphenyl-4,4'''-diamino-1,1':4',1'':4'',1'''-quaterphenyl;
Bis(4-dimethylamino-2-methylphenyl)phenylmethane;
1,4-bis[2-[4-[N,N-di(p-toly)amino]phenyl]vinyl]benzene (BDTAPVB);
N,N,N',N'-Tetra-p-tolyl-4,4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;

N-Phenylcarbazole;
4,4'-Bis[N-(1-naphthyl)-N-phenylamino]biphenyl (NPB);
4,4'-Bis[N-(1-naphthyl)-N-(2-naphthyl)amino]biphenyl (TNB);
4,4'-Bis[N-(1-naphthyl)-N-phenylamino]-p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4'-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]amino}biphenyl;
2,6-Bis[N,N-di(2-naphthyl)amino]fluorene;
4,4',4"-tris[(3-methylphenyl)phenylamino]triphenylamine (MTDATA); and
4,4'-Bis[N-(3-methylphenyl)-N-phenylamino]biphenyl (TPD).

Another class of useful hole-transporting materials includes polycyclic aromatic compounds as described in EP 1 009 041. Some hole-injecting materials described in EP 0 891 121 A1 and EP 1 029 909 A1 can also make useful hole-transporting materials. In addition, polymeric hole-transporting materials can be used including poly(N-vinylcarbazole) (PVK), polythiophenes, polypyrrole, polyaniline, and copolymers including poly(3,4-ethylenedioxythiophene)/poly(4-styrenesulfonate), also called PEDOT/PSS.

As more fully described in U.S. Pat. Nos. 4,769,292 and 5,935,721, each of the light-emitting layers (LEL) of the organic EL element include a luminescent fluorescent or phosphorescent material where electroluminescence is produced as a result of electron-hole pair recombination in this region. The light-emitting layer can be comprised of a single material, but more commonly contains a host material doped with a guest emitting material or materials where light emission comes primarily from the emitting materials and can be of any color. This guest emitting material is often referred to as a light-emitting dopant. The host materials in the light-emitting layer can be an electron-transporting material, as defined below, a hole-transporting material, as defined above, or another material or combination of materials that support hole-electron recombination. The emitting material is usually chosen from highly fluorescent dyes and phosphorescent compounds, e.g., transition metal complexes as described in WO 98/55561, WO 00/18851, WO 00/57676, and WO 00/70655. Emitting materials are typically incorporated at 0.01 to 10% by weight of the host material.

The host and emitting materials can be small non-polymeric molecules or polymeric materials including polyfluorenes and polyvinylarylenes, e.g. poly(p-phenylenevinylene), PPV. In the case of polymers, small molecule emitting materials can be molecularly dispersed into a polymeric host, or the emitting materials can be added by copolymerizing a minor constituent into a host polymer.

An important relationship for choosing an emitting material is a comparison of the bandgap potential which is defined as the energy difference between the highest occupied molecular orbital and the lowest unoccupied molecular orbital of the molecule. For efficient energy transfer from the host to the emitting material, a necessary condition is that the band gap of the dopant is smaller than that of the host material. For phosphorescent emitters (including materials that emit from a triplet excited state, i.e., so-called "triplet emitters") it is also important that the host triplet energy level of the host be high enough to enable energy transfer from host to emitting material.

Host and emitting materials known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; 6,020,078; and 6,534,199.

Metal complexes of 8-hydroxyquinoline and similar derivatives (Formula E) constitute one class of useful host or emissive materials capable of supporting electroluminescence, and are particularly suitable for light emission of wavelengths longer than 500 nm, e.g. green, yellow, orange, and red. Such materials are sometimes referred to as metal oxinoid materials.

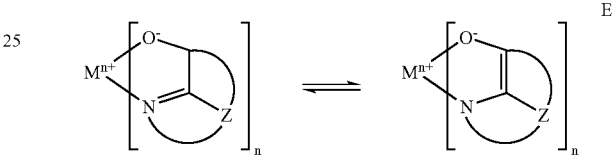

E wherein:
M represents a metal;
n is an integer of from 1 to 3; and
Z independently in each occurrence represents the atoms completing a nucleus having at least two fused aromatic rings.

From the foregoing it is apparent that the metal can be a monovalent, divalent, or trivalent metal. The metal can, for example, be an alkali metal, including lithium, sodium, or potassium; an alkaline earth metal, including magnesium or calcium; or an earth metal, including boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function, the number of ring atoms is usually maintained at 18 or less.

Illustrative of useful chelated oxinoid compounds are the following:
CO-1: Aluminum trisoxine [alias, tris(8-quinolinolato)aluminum(III)];
CO-2: Magnesium bisoxine [alias, bis(8-quinolinolato)magnesium(II)];
CO-3: Bis[benzo{f}-8-quinolinolato]zinc (II);
CO-4: Bis(2-methyl-8-quinolinolato)aluminum(III)-μ-oxo-bis(2-methyl-8-quinolinolato) aluminum(III);
CO-5: Indium trisoxine[alias, tris(8-quinolinolato)indium];
CO-6: Aluminum tris(5-methyloxine) [alias, tris(5-methyl-8-quinolinolato) aluminum(III)];
CO-7: Lithium oxine [alias, (8-quinolinolato)lithium(I)];
CO-8: Gallium oxine [alias, tris(8-quinolinolato)gallium (III)]; and
CO-9: Zirconium oxine [alias, tetra(8-quinolinolato)zirconium(IV)].

Anthracene derivatives represent another useful class of host or emissive materials for use in a light-emitting layer. For example, derivatives of 9,10-di-(2-naphthyl)anthracene (Formula F) constitute one class of useful host materials capable of supporting electroluminescence, and are particularly suitable for light emission of wavelengths longer than 400 nm, e.g. blue, green, yellow, orange or red.

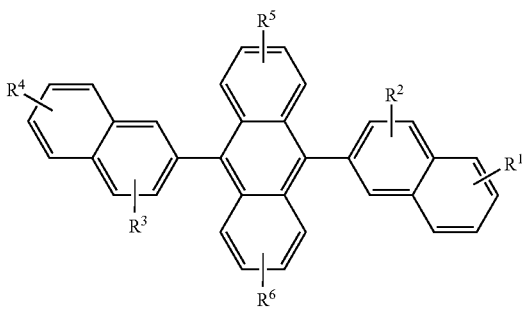

F wherein $R^1$, $R^2$, $R^3$, $R^4$, $R^5$, and $R^6$ represent one or more substituents on each ring where each substituent is individually selected from the following groups:

Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl, pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

The monoanthracene derivative of Formula I is also a useful host material capable of supporting electroluminescence, and is particularly suitable for light emission of wavelengths longer than 400 nm, e.g. blue, green, yellow, orange or red. Anthracene derivatives of Formula I are described in commonly assigned U.S. patent application Ser. No. 10/693,121 filed Oct. 24, 2003 by Lelia Cosimbescu et al., entitled "Electroluminescent Device With Anthracene Derivative Host", the disclosure of which is herein incorporated by reference,

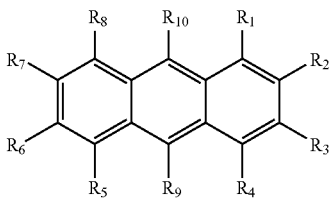

I wherein:
$R_1$–$R_8$ are H;
$R_9$ is a naphthyl group containing no fused rings with aliphatic carbon ring members; provided that $R_9$ and $R_{10}$ are not the same, and are free of amines and sulfur compounds. Suitably, $R_9$ is a substituted naphthyl group with one or more further fused rings such that it forms a fused aromatic ring system, including a phenanthryl, pyrenyl, fluoranthene, perylene, or substituted with one or more substituents including fluorine, cyano group, hydroxy, alkyl, alkoxy, aryloxy, aryl, a heterocyclic oxy group, carboxy, trimethylsilyl group, or an unsubstituted naphthyl group of two fused rings. Conveniently, $R_9$ is 2-naphthyl, or 1-naphthyl substituted or unsubstituted in the para position; and $R_{10}$ is a biphenyl group having no fused rings with aliphatic carbon ring members. Suitably $R_{10}$ is a substituted biphenyl group, such that it forms a fused aromatic ring system including, but not limited to, a naphthyl, phenanthryl, perylene, or substituted with one or more substituents including fluorine, cyano group, hydroxy, alkyl, alkoxy, aryloxy, aryl, a heterocyclic oxy group, carboxy, trimethylsilyl group, or an unsubstituted biphenyl group. Conveniently, $R_{10}$ is 4-biphenyl, 3-biphenyl unsubstituted or substituted with another phenyl ring without fused rings to form a terphenyl ring system, or 2-biphenyl. Particularly useful is 9-(2-naphthyl)-10-(4-biphenyl)anthracene.

Another useful class of anthracene derivatives is represented by general Formula II $$A\ 1\text{-}L\text{-}A\ 2 \qquad \text{II}$$

wherein:
A 1 and A 2 each represent a substituted or unsubstituted monophenylanthryl group or a substituted or unsubstituted diphenylanthryl group and can be the same with or different from each other; and
L represents a single bond or a divalent linking group.

Another useful class of anthracene derivatives is represented by general Formula III $$A\ 3\text{-}An\text{-}A\ 4 \qquad \text{III}$$

wherein:
An represents a substituted or unsubstituted divalent anthracene residue group; and
A 3 and A 4 each represent a substituted or unsubstituted monovalent condensed aromatic ring group or a substituted or unsubstituted non-condensed ring aryl group having 6 or more carbon atoms and can be the same with or different from each other.

Specific examples of useful anthracene materials for use in a light-emitting layer include

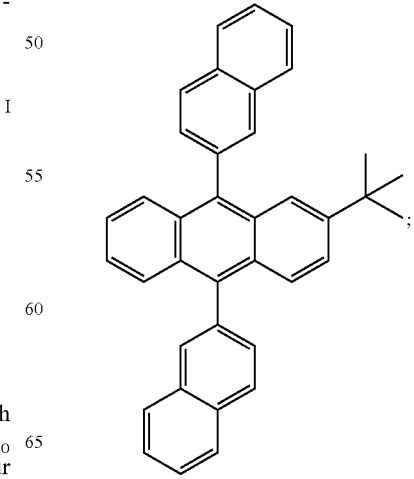

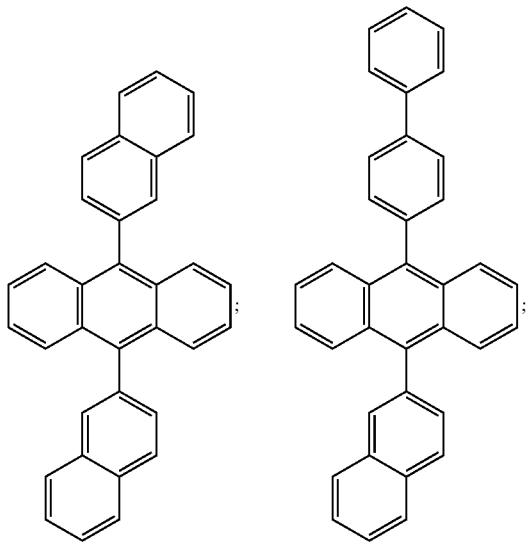
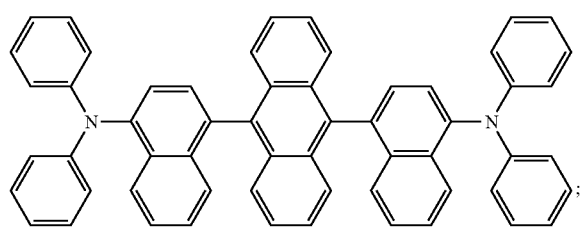
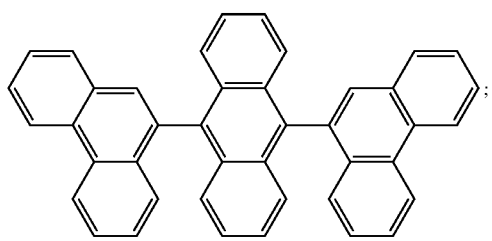
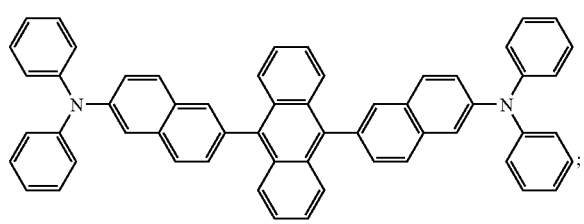
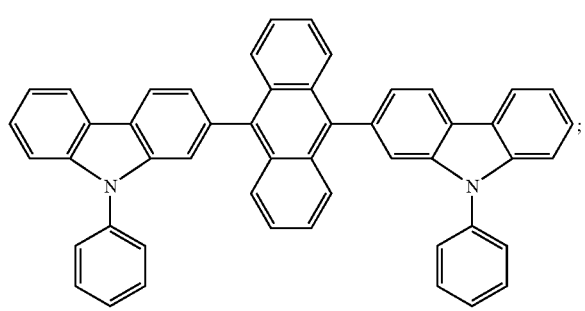

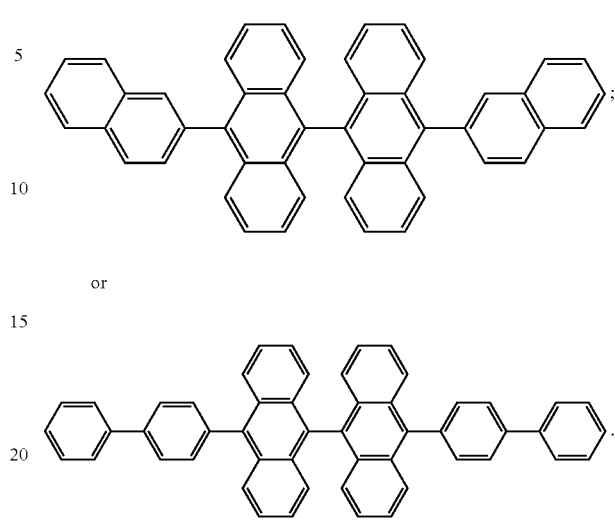

or

Benzazole derivatives (Formula G) constitute another class of useful host materials capable of supporting electroluminescence, and are particularly suitable for light emission of wavelengths longer than 400 nm, e.g. blue, green, yellow, orange or red.

$$\text{L}\!\!-\!\!\left[\begin{array}{c}\text{N}\\ \diagup\!\!\diagdown\\ \text{Z}\end{array}\!\!\!-\!\!\text{R}'\right]_n \qquad G$$

where:
n is an integer of 3 to 8;
Z is O, NR or S;
R' is hydrogen; alkyl of from 1 to 24 carbon atoms, for example, propyl, t-butyl, heptyl, and the like; aryl or heteroatom substituted aryl of from 5 to 20 carbon atoms, for example phenyl and naphthyl, furyl, thienyl, pyridyl, quinolinyl and other heterocyclic systems; or halo including chloro, fluoro; or atoms necessary to complete a fused aromatic ring; and
L is a linkage unit including alkyl, aryl, substituted alkyl, or substituted aryl, which conjugately or unconjugately connects the multiple benzazoles together. An example of a useful benzazole is 2,2',2"-(1,3,5-phenylene)tris[1-phenyl-1H-benzimidazole].

Desirable fluorescent dopants include perylene or derivatives of perylene, derivatives of anthracene, tetracene, xanthene, rubrene, coumarin, rhodamine, quinacridone, dicyanomethylenepyran compounds, thiopyran compounds, polymethine compounds, pyrilium and thiapyrilium compounds, derivatives of distyrylbenzene or distyrylbiphenyl, bis(azinyl)methane boron complex compounds, and carbostyryl compounds. Among derivatives of distyrylbenzene, particularly useful are those substituted with diarylamino groups, informally known as distyrylamines. Illustrative examples of useful dopants include, but are not limited to, the following:

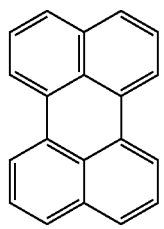
L1
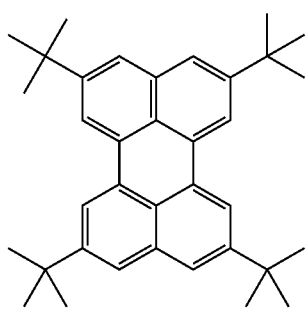
L2
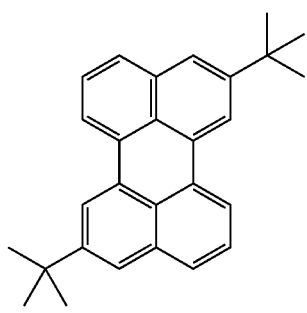
L3
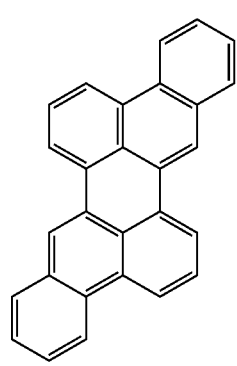
L4
-continued
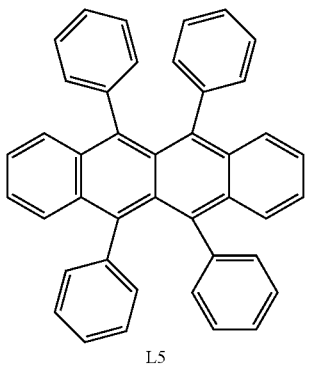
L5
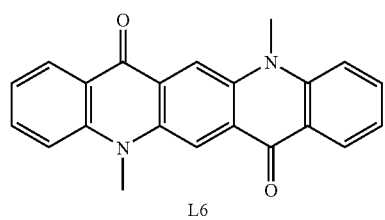
L6
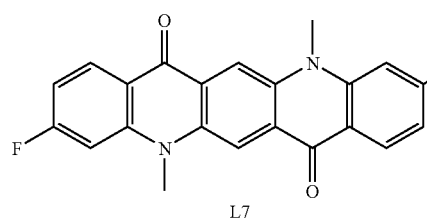
L7
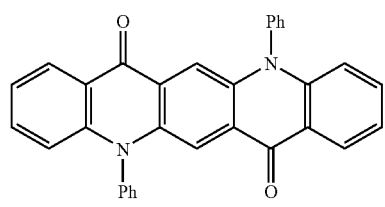
L8
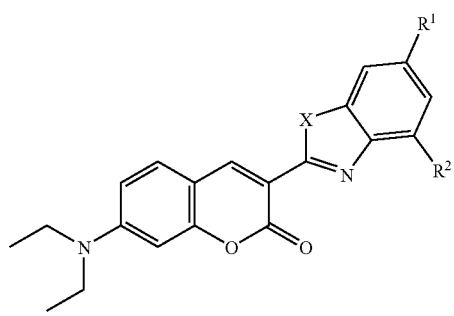
|     | X | R1 | R2 |
|-----|---|-----|------|
| L9  | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |

-continued
| | | | |
|---|---|---|---|
| L19 | S | Methyl | Methyl |
| L20 | S | H | t-butyl |
| L21 | S | t-butyl | H |
| L22 | S | t-butyl | t-butyl |
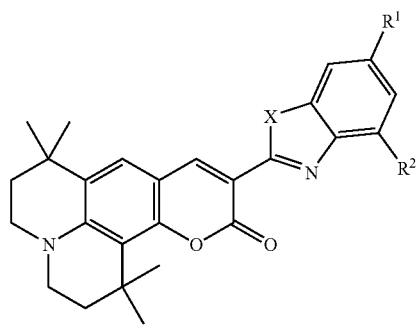
| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |
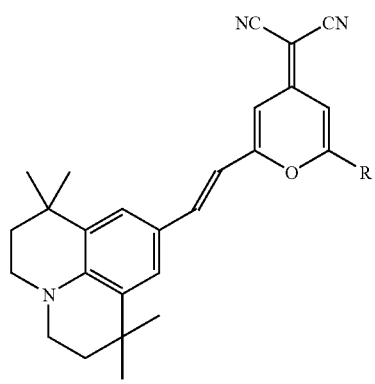
| | R |
|---|---|
| L37 | phenyl |
| L38 | methyl |
| L39 | t-butyl |
| L40 | mesityl |
-continued
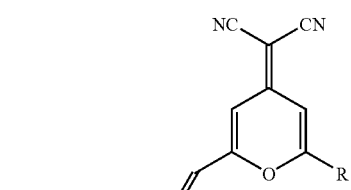
| | R |
|---|---|
| L41 | phenyl |
| L42 | methyl |
| L43 | t-butyl |
| L44 | mesityl |
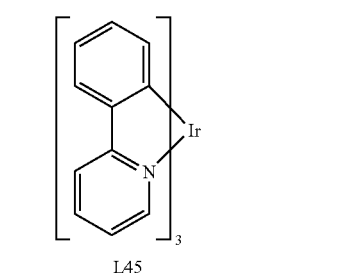
L45
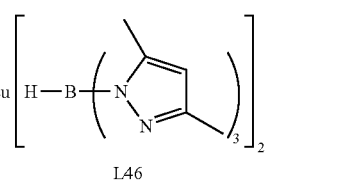
L46
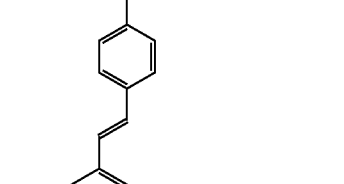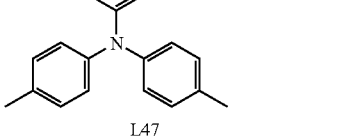
L47

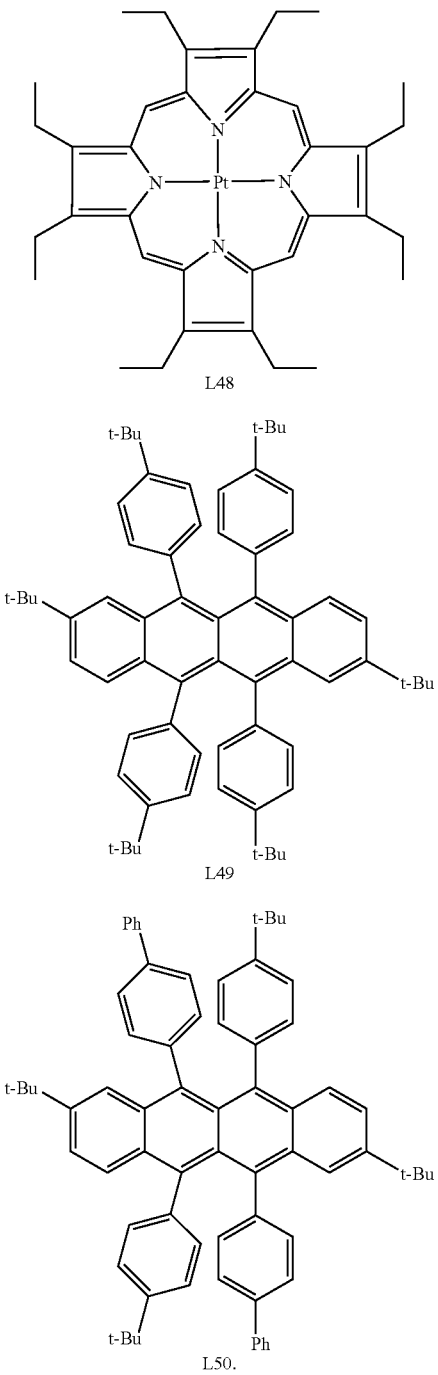

L48

L49

L50.

Suitable host materials for phosphorescent emitters (including materials that emit from a triplet excited state, i.e., so-called "triplet emitters") should be selected so that the triplet exciton can be transferred efficiently from the host material to the phosphorescent material. For this transfer to occur, it is a highly desirable condition that the excited state energy of the phosphorescent material be lower than the difference in energy between the lowest triplet state and the ground state of the host. However, the band gap of the host should not be chosen so large as to cause an unacceptable increase in the drive voltage of the OLED. Suitable host materials are described in WO 00/70655 A2; WO 01/39234 A2, WO 01/93642 A1, WO 02/074015 A2, WO 02/15645 A1, and U.S. Patent Application Publication 2002/0117662. Suitable hosts include certain aryl amines, triazoles, indoles and carbazole compounds. Examples of desirable hosts are 4,4'-N,N'-dicarbazole-biphenyl (CBP), 2,2'-dimethyl-4,4'-N, N'-dicarbazole-biphenyl, m-(N,N'-dicarbazole)benzene, and poly(N-vinylcarbazole), including their derivatives.

Desirable host materials are capable of forming a continuous film. The light-emitting layer can contain more than one host material in order to improve the device's film morphology, electrical properties, light emission efficiency, and lifetime. The light-emitting layer can contain a first host material that has good hole-transporting properties, and a second host material that has good electron-transporting properties.

Examples of useful phosphorescent materials that can be used in light-emitting layers of this invention include, but are not limited to, those described in WO 00/57676; WO 00/70655; WO 01/41512 A1; WO 02/15645 A1; U.S. Patent Application Publication 2003/0017361 A1; WO 01/93642 A1; WO 01/39234 A2; U.S. Pat. No. 6,458,475 B1; WO 02/071813 A1; U.S. Pat. No. 6,573,651 B2; U.S. Patent Application Publication 2002/0197511 A1; WO 02/074015 A2; U.S. Pat. No. 6,451,455 B1; U.S. Patent Application Publications 2003/0072964 A1 and 2003/0068528 A1; U.S. Pat. Nos. 6,413,656 B1, 6,515,298 B2, 6,451,415 B1, and 6,097,147; U.S. Patent Application Publications 2003/0124381 A1, 2003/0059646 A1, and 2003/0054198 A1; EP 1 239 526 A2; EP 1 238 981 A2; EP 1 244 155 A2; U.S. Patent Application Publications 2002/0100906 A1, 2003/0068526 A1, and 2003/0068535 A1; JP 2003073387A; JP 2003 073388A; U.S. Patent Application Publications 2003/0141809 A1 and 2003/0040627 A1; JP 2003059667A; JP 2003073665A; and U.S. Patent Application Publication 2002/0121638 A1.

The emission wavelengths of cyclometallated Ir(III) complexes of the type $IrL_3$ and $IrL_2L'$, such as the green-emitting fac-tris(2-phenylpyridinato-N,$C^{2'}$)Iridium(III) and bis(2-phenylpyridinato-N,$C^{2'}$)Iridium(III)(acetylacetonate) can be shifted by substitution of electron donating or withdrawing groups at appropriate positions on the cyclometallating ligand L, or by choice of different heterocycles for the cyclometallating ligand L. The emission wavelengths can also be shifted by choice of the ancillary ligand L'. Examples of red emitters are the bis(2-(2'-benzothienyl)pyridinato-N,$C^{3'}$)Iridium(III)(acetylacetonate) and tris(1-phenylisoquinolinato-N,C)Iridium(III). A blue-emitting example is bis(2-(4,6-diflourophenyl)-pyridinato-N,$C^{2'}$)Iridium(III) (picolinate).

Red electrophosphorescence has been reported, using bis(2-(2'-benzo[4,5-a]thienyl)pyridinato-N,$C^3$)iridium (acetylacetonate)[$Btp_2Ir(acac)$] as the phosphorescent material (Adachi, C., Lamansky, S., Baldo, M. A., Kwong, R. C., Thompson, M. E., and Forrest, S. R., *App. Phys. Lett.,* 78, 1622–1624 [2001])

Still other examples of useful phosphorescent materials include coordination complexes of the trivalent lanthanides such as $Tb^{3+}$ and $Eu^{3+}$ (J. Kido et al., *Appl. Phys. Lett.,* 65, 2124 [1994]).

In addition to suitable hosts, an OLED device employing a phosphorescent material often requires at least one exciton or hole-blocking layer to help confine the excitons or electron-hole recombination centers to the light-emitting layer comprising the host and phosphorescent material. In one embodiment, such a blocking layer would be placed between a phosphorescent light-emitting layer and the cathode, and in contact with the phosphorescent light-emitting layer. In this case, the ionization potential of the blocking layer should be such that there is an energy barrier for hole migration from the host into the electron-transporting layer (or the metal-doped organic layer), while the electron affinity should be such that electrons pass more readily from the electron-transporting layer (or the metal-doped organic layer) into the light-emitting layer comprising host and phosphorescent material. It is further desired, but not absolutely required, that the triplet energy of the blocking material be greater than that of the phosphorescent material. Suitable hole-blocking materials are described in WO 00/70655A2 and WO 01/93642 A1. Two examples of useful materials are bathocuproine (BCP) and bis(2-methyl-8-quinolinolato)(4-phenylphenolato)-Aluminum(III) (BAlQ). Metal complexes other than Balq are also known to block holes and excitons as described in U.S. Patent Application Publication 2003/0068528 A1. U.S. Patent Application Publication 2003/0175553 A1 describes the use of fac-tris(1-phenylpyrazolato-N,C 2)iridium(III) (Irppz) in an electron/exciton blocking layer.

When any of the light-emitting layers of this invention emit blue light, preferred hosts are those represented by Formulas D, I, II, and III. Particularly useful blue light-emitting dopants contained in a blue light-emitting layer include perylene and derivatives thereof, derivatives of distyrylbenzene and distyrylbiphenyl, and compounds of the structure

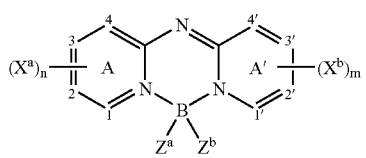

wherein:

A and A' represent independent azine ring systems corresponding to 6-membered aromatic ring systems containing at least one nitrogen;

$(X^a)_n$ and $(X^b)_m$ represent one or more independently selected substituents and include acyclic substituents or are joined to form a ring fused to A or A';

m and n are independently 0 to 4;

$Z^a$ and $Z^b$ are independently selected substituents;

1, 2, 3, 4, 1', 2', 3', and 4' are independently selected as either carbon or nitrogen atoms; and that $X^a$, $X^b$, $Z^a$, and $Z^b$, 1, 2, 3, 4, 1', 2', 3', and 4' are selected to provide blue luminescence.

Some examples of the above class of dopants include the following:

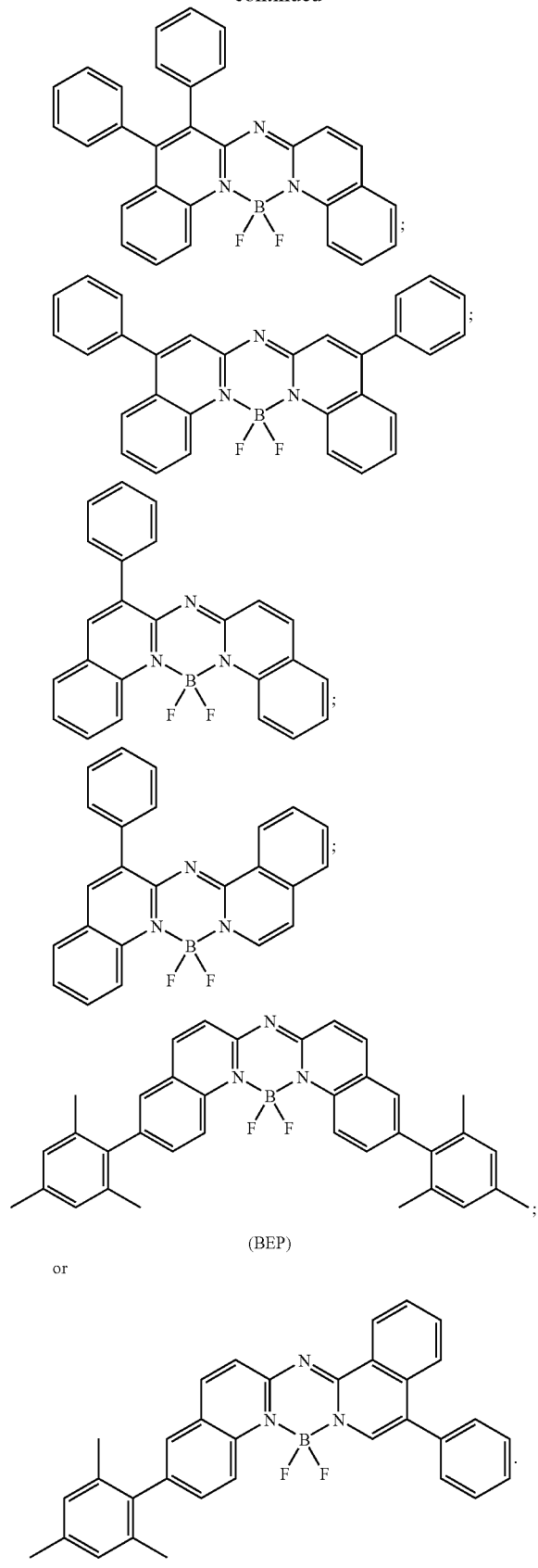

Another particularly useful class of blue dopants in this invention includes blue-emitting derivatives of such distyrylarenes as distyrylbenzene and distyrylbiphenyl, including compounds described in U.S. Pat. No. 5,121,029. Among derivatives of distyrylarenes that provide blue luminescence, particularly useful are those substituted with diarylamino groups, also known as distyrylamines. Examples include bis[2-[4-[N,N-diarylamino]phenyl]vinyl]-arylenes of the general structure N1 shown below:

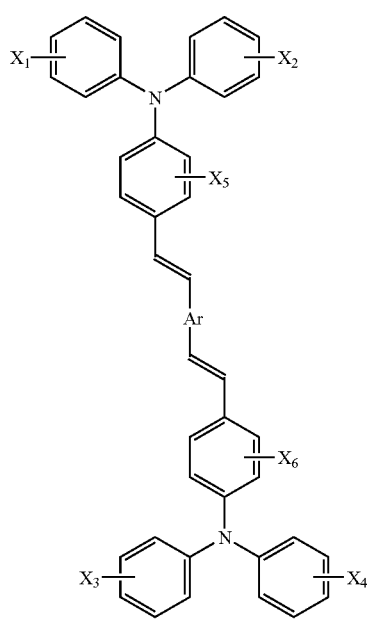

N1 and bis[2-[4-[N,N-diarylamino]phenyl]vinyl]biphenyls of the general structure N2 shown below:

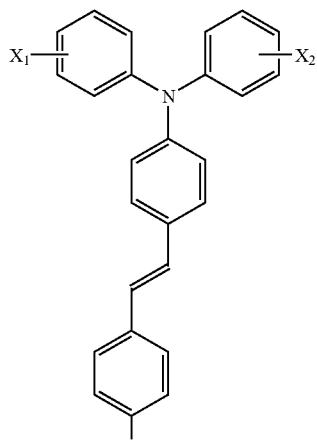

N2

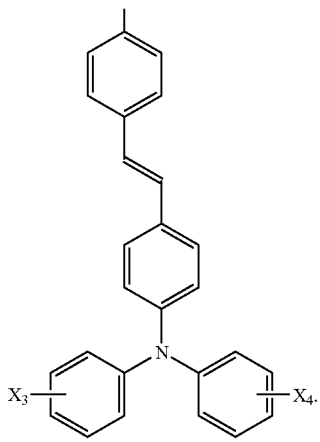

In Formulas N1 and N2, $X_1$–$X_6$ can be the same or different, and individually represent one or more substituents including alkyl, aryl, fused aryl, halo, or cyano. In Formula N1, Ar represents a divalent aryl group having 6 to 20 carbon atoms, preferably selected from phenyl, naphthyl, or anthracenyl. In a preferred embodiment, $X_1$–$X_4$ are individually alkyl groups, each containing from one to about ten carbon atoms. A particularly preferred blue dopant of this class is 1,4-bis[2-[4-[N,N-di(p-tolyl)amino]phenyl]vinyl]benzene (BDTAPVB, Formula L47)

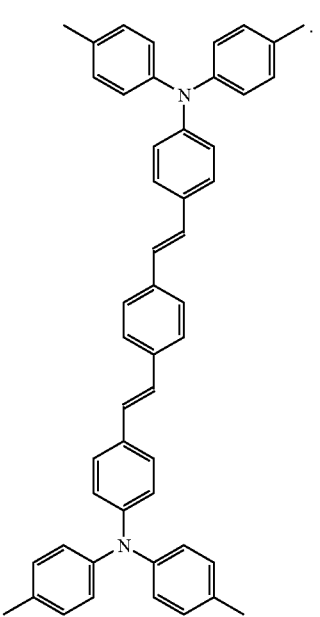

L47

Particularly useful blue dopants of the perylene class include perylene (L1) and tetra-t-butylperylene (TBP, L2)

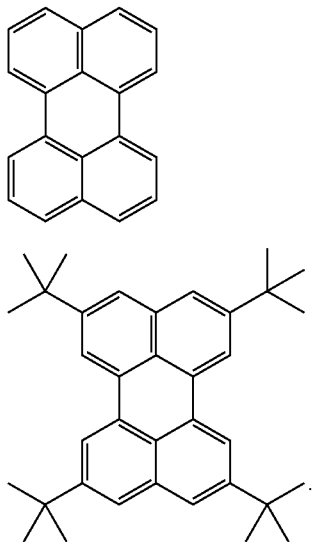

In addition to a host and a light-emitting dopant, it can be useful to include in a blue emitting layer an arylamine material, including those that might be used in a hole-transporting layer. Arylamines including NPB can be incorporated into the blue layer in a range of from 0.5% to 40% by weight. Preferably, the arylamine is incorporated in a range of from 2% to 15% by weight.

Certain yellow, orange, and red emissive materials can be particularly useful for this invention. A light-emitting yellow dopant can include a compound of the following structures:

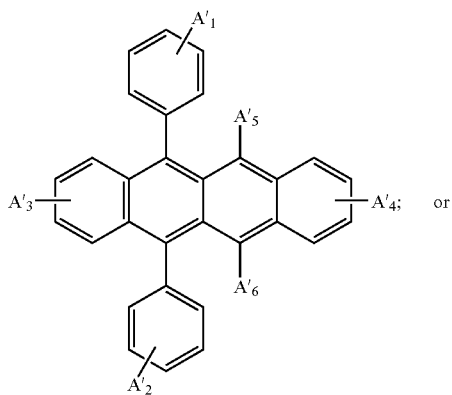

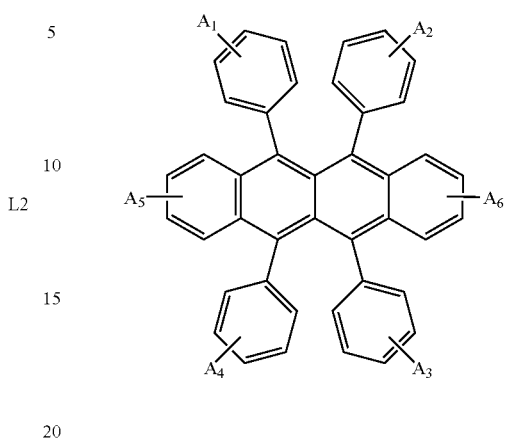

wherein $A_1$–$A_6$ represent one or more substituents on each ring and where each substituent is individually selected from one of the following:

Category 1: hydrogen, or alkyl of from 1 to 24 carbon atoms;

Category 2: aryl or substituted aryl of from 5 to 20 carbon atoms;

Category 3: hydrocarbon containing 4 to 24 carbon atoms, completing a fused aromatic ring or ring system;

Category 4: heteroaryl or substituted heteroaryl of from 5 to 24 carbon atoms includes thiazolyl, furyl, thienyl, pyridyl, quinolinyl or other heterocyclic systems, which are bonded via a single bond, or complete a fused heteroaromatic ring system;

Category 5: alkoxylamino, alkylamino, or arylamino of from 1 to 24 carbon atoms; or Category 6: fluoro, chloro, bromo or cyano.

Examples of particularly useful yellow dopants include 5,6,11,12-tetraphenylnaphthacene (rubrene); 6,11-diphenyl-5,12-bis(4-(6-methyl-benzothiazol-2-yl)phenyl)naphthacene (DBzR) and 5,6,11,12-tetra(2-naphthyl)naphthacene (NR), the formulas of which are shown below:

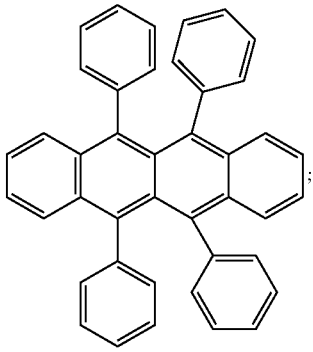

(Rubrene)

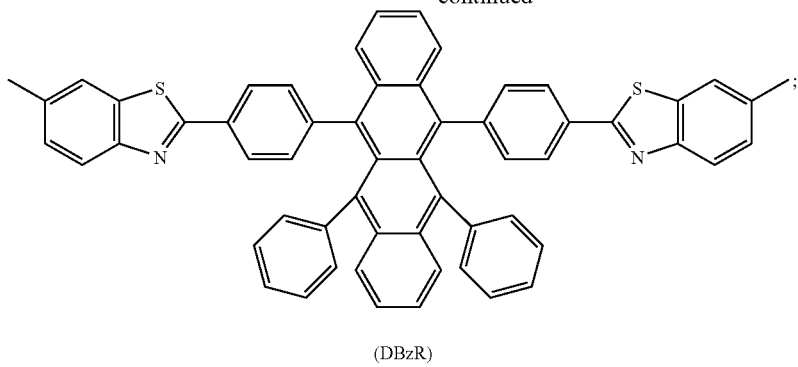
(DBzR)
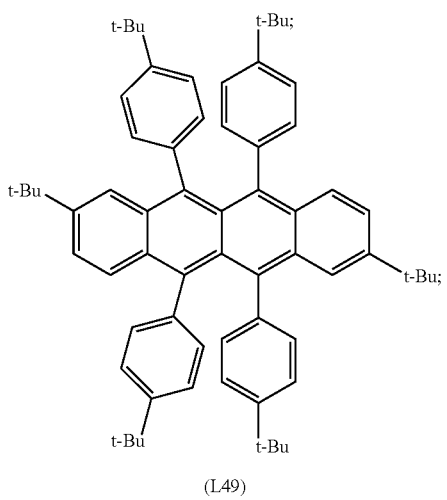
(L49)
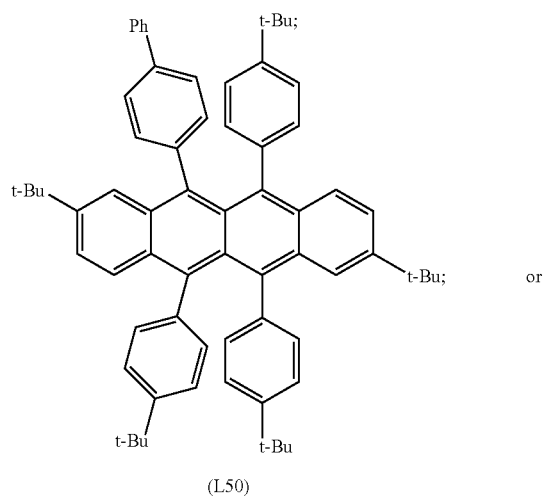
(L50) or
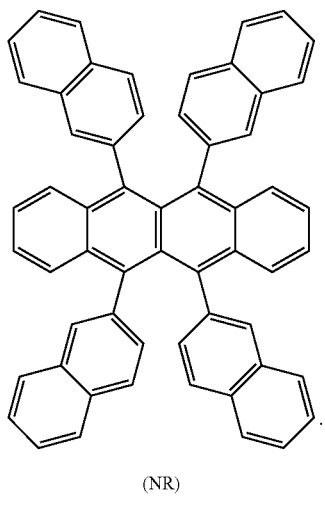
(NR)
The yellow dopant can also be a mixture of compounds that would also be yellow dopants individually.

A light-emitting yellow to red dopant can include a diindenoperylene compound of the following structure Q1

Q1

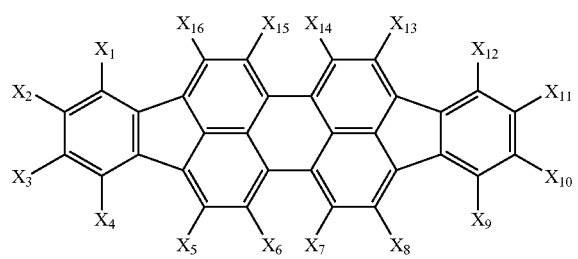

wherein $X_1$–$X_{16}$ are independently selected as hydrogen or substituents that provide yellow to red luminescence. Preferred substituents include alkyl groups of from 1 to 24 carbon atoms; aryl or substituted aryl groups of from 5 to 20 carbon atoms; hydrocarbon groups containing 4 to 24 carbon atoms that complete one or more fused aromatic rings or ring systems; or halogen.

Illustrative examples of useful dopants of this class include the following:

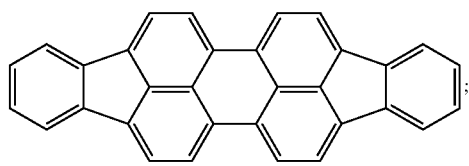

periflanthene

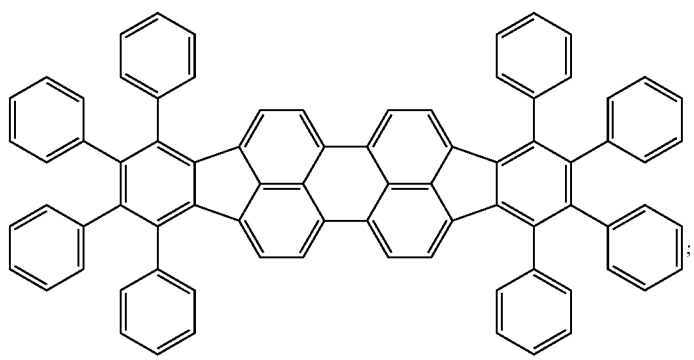

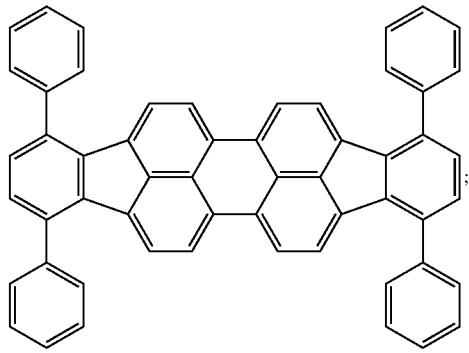

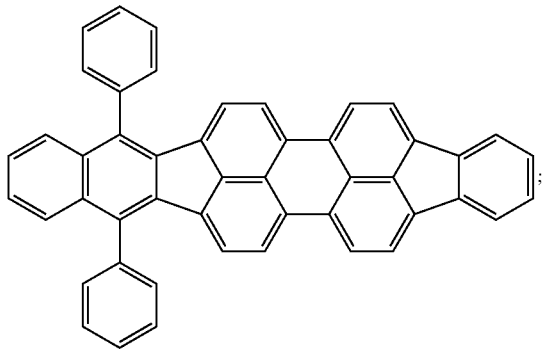

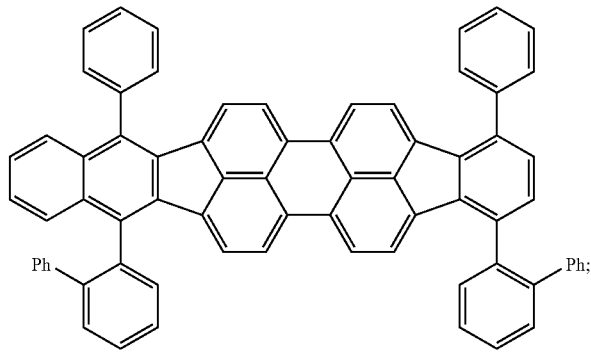

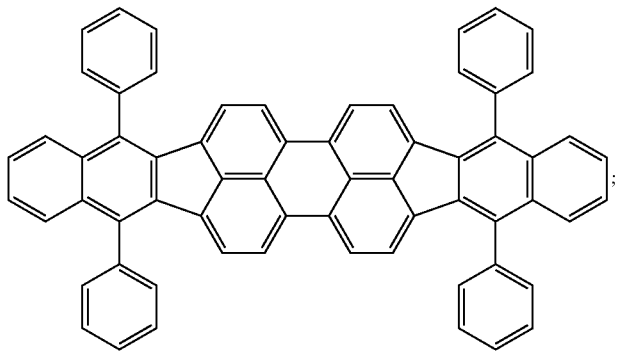
TPDBP
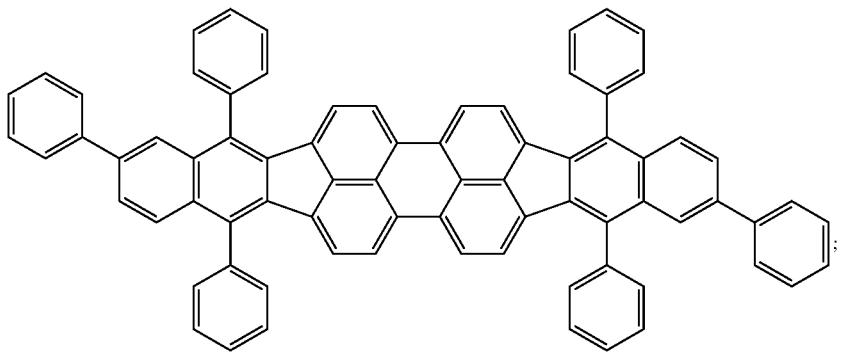
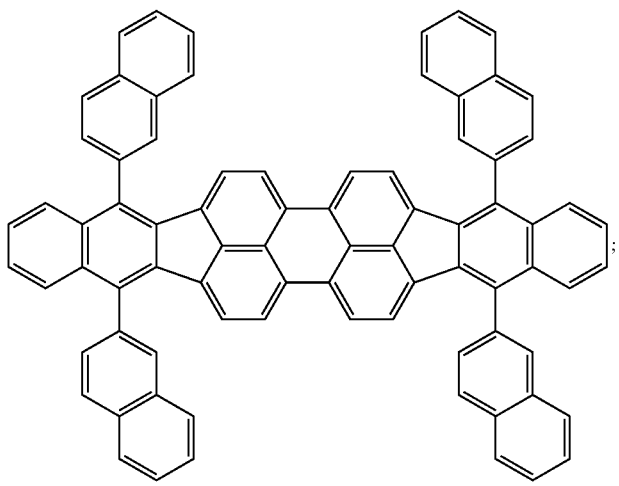
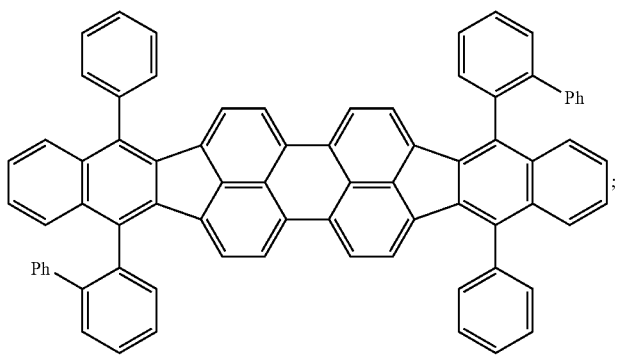

-continued
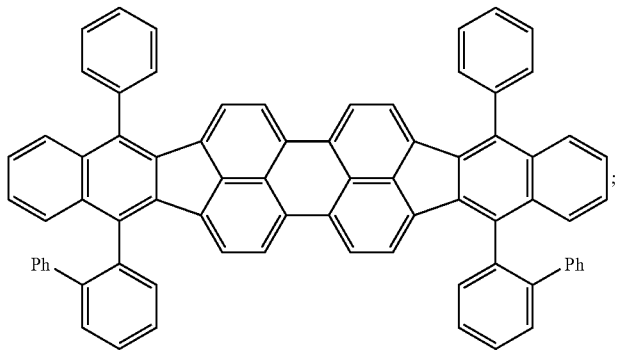;
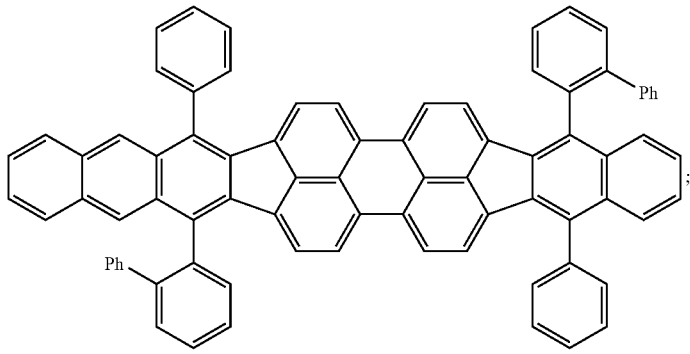;
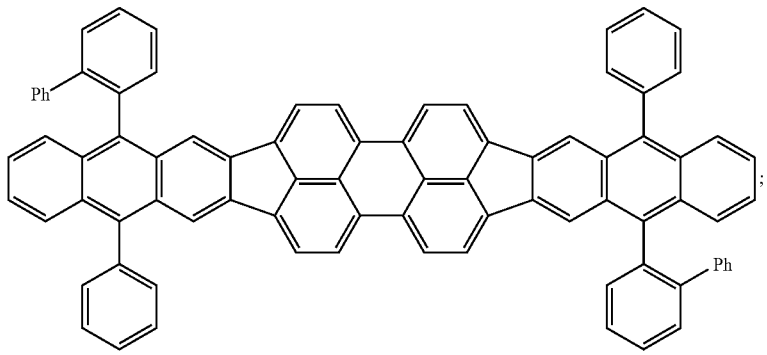;
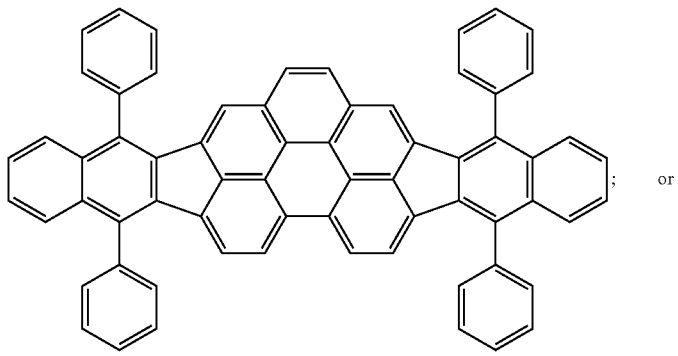; or

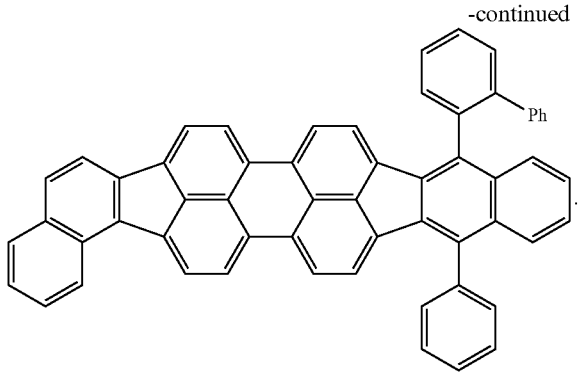

A particularly preferred diindenoperylene dopant that emits red light is dibenzo{[f,f']-4,4'7,7'-tetraphenyl]diindeno-[1,2,3-cd:1',2',3'-lm]perylene (TPDBP above).

Other red dopants useful in the present invention belong to the DCM class of dyes represented by Formula S1

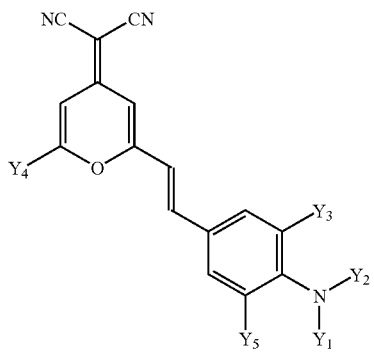

Formula S1 wherein:

Y$_1$–Y$_5$ represent one or more groups independently selected from hydro, alkyl, substituted alkyl, aryl, or substituted aryl; and Y$_1$–Y$_5$ independently include acyclic groups or are joined pairwise to form one or more fused rings, provided that Y$_3$ and Y$_5$ do not together form a fused ring.

In a useful and convenient embodiment that provides red luminescence, Y$_1$–Y$_5$ are selected independently from hydro, alkyl, and aryl. Structures of particularly useful dopants of the DCM class are shown below:

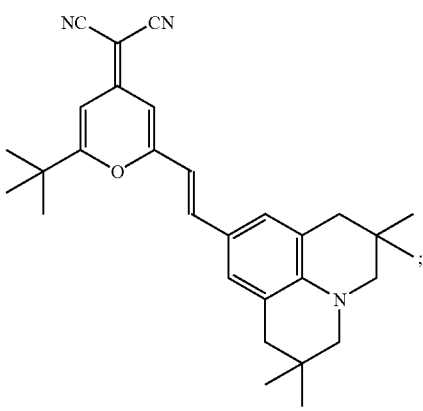

DCJTB

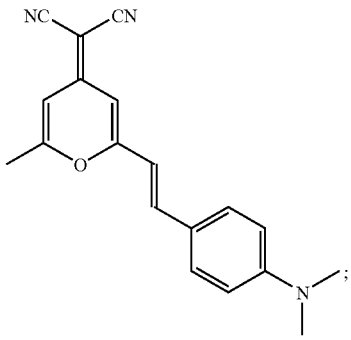

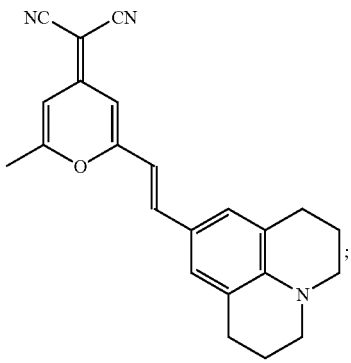

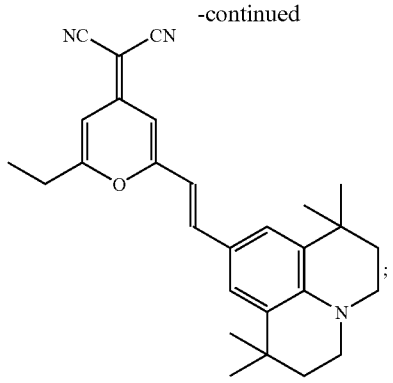

L37

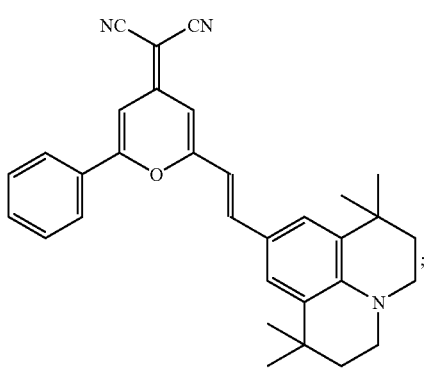

L38

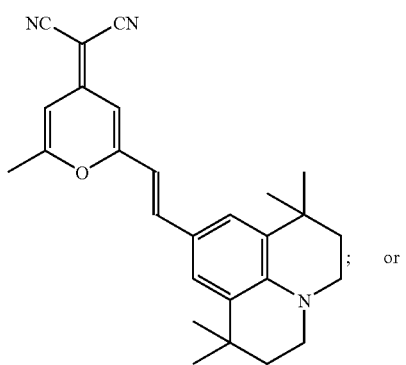
; or

L40

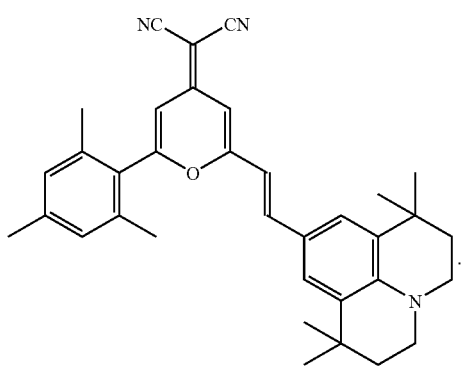

A preferred DCM dopant is DCJTB. The red dopant can also be a mixture of compounds that would also be red dopants individually. Further, a yellow, orange, or red light-emitting layer can include a mixture of red-emitting and yellow-emitting dopants. Tetracene derivatives, including rubrene, can function as good host materials for yellow to red light-emitting layers. Tetracene derivatives are particularly useful in combination with other hosts including anthracene derivatives (e.g., TBADN), metal oxinoid derivatives (e.g., Alq), and arylamine derivatives (e.g, NPB).

A green light-emitting layer, including the third light-emitting layer 355 can be comprised of a single material including Formula E, but can include at least one host and at least one dopant. Commonly chosen host materials include anthracene derivatives, including those shown in Formulas D, I, II, and III, and metal including that shown in Formula E, as previously described. Commonly chosen green-emitting dopant materials include quinacridone derivatives, examples of which are shown below

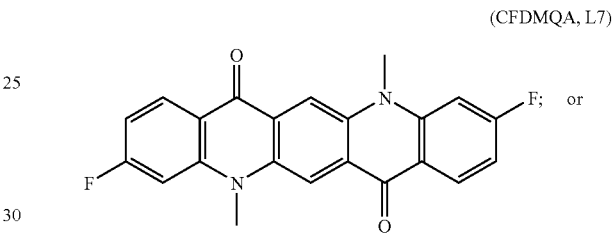
(CFDMQA, L7)

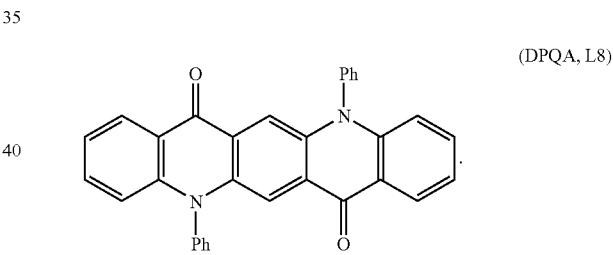
(DPQA, L8)

Other commonly chosen green-emitting dopant materials include coumarin derivatives, an example of which is shown below

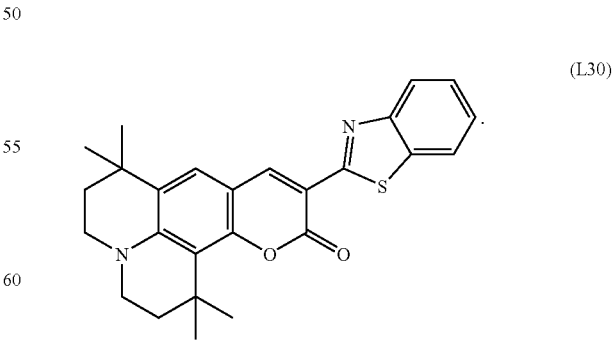
(L30)

The light-emitting layer can comprise various stabilizing materials. Such materials are coated along with the host material, but at lower amounts and often have an energy bandgap between that of the primary host and that of the light-emitting dopant material. Some examples of stabilizing materials include perylenes including dibenzoperylene and diaryltetracenes, including tBuDPN, shown below

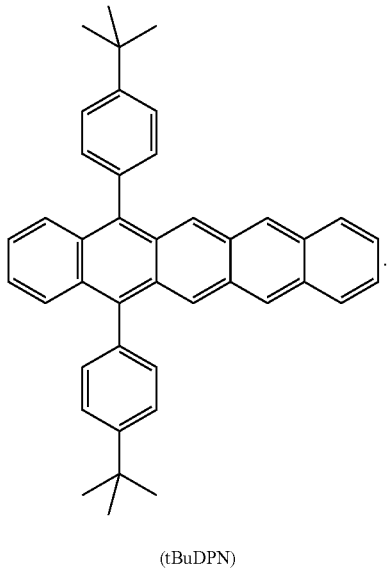

(tBuDPN)

An electron-transporting layer not doped with a low work function metal can optionally be included adjacent to the metal-doped organic layer. That is, an ETL can be provided between the light-emitting layer and the metal-doped layer, between the metal-doped layer and the cathode, or both. The electron transporting materials suitable for use in the electron-transporting layer include metal oxinoid compounds including those defined in Formula E, anthracene derivatives, and phenanthroline derivatives. Other useful electron-transporting materials include various butadiene derivatives as disclosed in U.S. Pat. No. 4,356,429 and various heterocyclic optical brighteners as described in U.S. Pat. No. 4,539,507. Benzazoles satisfying structural Formula G are also useful electron-transporting materials.

Related materials, denoted collectively as BAlq, can also be used as electron-transporting materials. Bryan et al., in U.S. Pat. No. 5,141,671, discuss such materials. The BAlq compounds are mixed-ligand aluminum chelates, specifically bis($R_s$-8-quinolinolato)(phenolato)aluminum(III) chelates, where $R_s$ is a ring substituent of the 8-quinolinolato ring nucleus. These compounds are represented by the formula $(R_s Q)_2 AlOL$, where Q represents a substituted 8-quinolinolato ligand, $R_s$ represents an 8-quinolinolato ring substituent to block sterically the attachment of more than two substituted 8-quinolinolato ligands to the aluminum ion, OL is phenolato ligand, O is oxygen, and L is phenyl or a hydrocarbon-substituted phenyl moiety of from 6 to 24 carbon atoms. These materials also make good hole- or exciton-blocking layers for use with triplet emitting materials, as is known in the art.

Other electron-transporting materials can be polymeric substances, e.g. polyphenylenevinylene derivatives, poly-para-phenylene derivatives, polyfluorene derivatives, polyacetylenes, and other conductive polymeric organic materials including those listed in *Handbook of Conductive Molecules and Polymers*, Vols. 1–4, H. S. Nalwa, ed., John Wiley and Sons, Chichester (1997).

The organic EL media materials mentioned above are suitably deposited through a vapor phase method including sublimation, sputtering, chemical vapor deposition, and thermal transfer from a donor element. Organic EL media materials can alternatively be deposited from a fluid, for example, from a solvent with an optional binder to improve film formation. Deposition from a fluid can be done in many ways including, but not limited to, ink-jet, spin coating, curtain coating, spray coating, and electrochemical deposition. If the material is a polymer, solvent deposition is usually preferred, but other methods can be used, including sputtering, electrochemical deposition, electrophoretic deposition, or thermal transfer from a donor sheet. The material to be deposited by sublimation can be vaporized from a sublimation "boat" often comprised of a tantalum material, e.g. as described in U.S. Pat. No. 6,237,529, or can be first coated onto a donor sheet and then sublimed in closer proximity to the substrate. Layers with a mixture of materials can utilize separate sublimation boats or the materials can be premixed and coated from a single boat or donor sheet.

Figure 4:
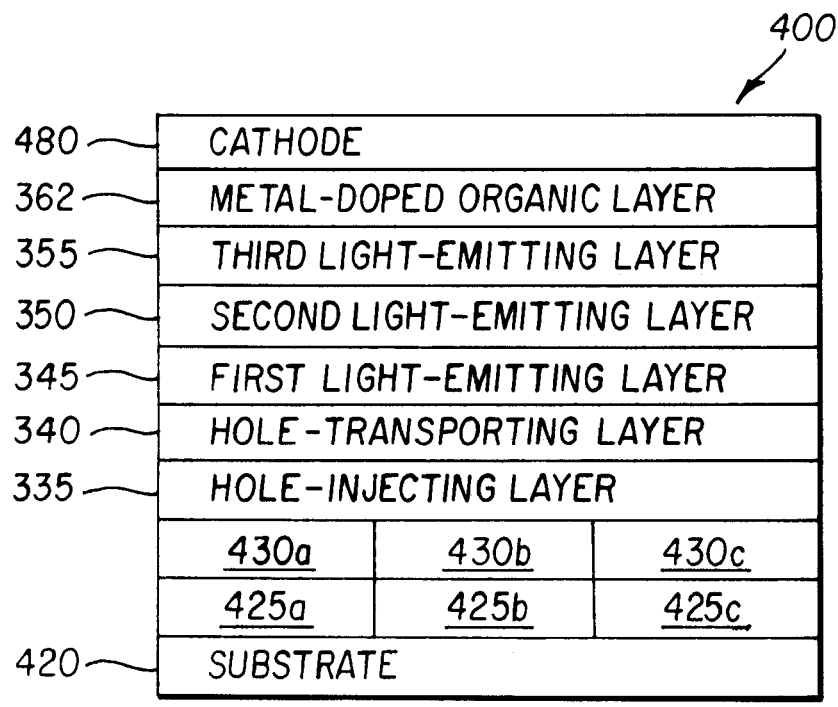
FIG. 4 shows a cross-sectional view of a full color OLED having white light emission and color filters in accordance with this invention.

Turning now to FIG. 4, there is shown a cross-sectional view of an OLED device 400 according to another embodiment of this invention. This embodiment is similar to the previous embodiment, except that a color filter array is disposed over substrate 420, and the subpixels of a full-color pixel with multicolor filters are shown. Color filters 425*a*, 425*b*, and 425*c* are constructed to have a bandpass spectrum to pass a preselected color of light in response to white light, so as to produce a preselected color output. A combination particularly useful in a full color OLED device is a color filter array including at least three separate color filters 425*a*, 425*b*, and 425*c* that have bandpass spectra from 605 nm to 700 nm, from 495 nm to 555 nm, and from 435 nm to 480 nm, for passing red, green, and blue light, respectively. Several types of color filters are known in the art. In a display comprising multiple pixels, the space between the individual color filter elements can also be filled with a black matrix (not shown) to reduce pixel cross talk and improve the display's contrast. While color filters 425*a*, 425*b*, and 425*c* are shown here as being located between anodes 430*a*, 430*b*, and 430*c* and substrate 420, it can alternatively be located on the outside surface of substrate 420 or on a separate support. For a top-emitting device, color filters 425*a*, 425*b*, and 425*c* can be disposed over the organic layers, over cathode 480, over a thin film encapsulation, or on a separate support that is aligned and laminated to the substrate. The color filter array includes at least three separate filters, e.g. red color filter 425*a*, green color filter 425*b*, and blue color filter 425*c*, each of which forms part of a red, green, and blue subpixel, respectively. Each subpixel has its own anode 430*a*, 430*b*, and 430*c*, respectively, which are capable of independently causing emission of the individual subpixel. Alternatively, the color filters can be replaced with color change media (CCM). Color change media absorbs light of one wavelength and emits light of a longer wavelength by fluorescence. Commonly, a CCM layer absorbs blue or green light and emits green or red. CCM layers can be used in conjunction with color filters.

The contrast of the display can be improved using a polarizing layer, in particular, by using a circular polarizer as is well known in the art.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. Nos. 6,226,890 and 6,656,609.

In addition, inorganic and/or organic barrier layers can be coated over the OLED to provide improved sealing against moisture penetration. Alternating layers of inorganic and organic barrier layers are particularly useful.

Some examples of inorganic barrier layer materials include dielectrics such as aluminum oxide, silicon dioxide, silicon nitride, silicon oxynitride, indium-tin oxide, diamond-like carbon, and composite materials such as, for example, zinc sulfide:silicon dioxide. Such inorganic dielectric materials can form inorganic dielectric layers by condensing from the vapor phase in deposition processes which include thermal physical vapor deposition, sputter deposition, chemical vapor deposition, plasma-enhanced chemical vapor deposition, laser-induced chemical vapor deposition, induction-assisted chemical vapor deposition, electron-beam assisted vapor deposition, and atomic layer deposition processes.

In some cases, the inorganic barrier layer can include conductive metals. Examples of metals from which a metal layer can be formed by deposition from a vapor phase include, but are not limited to, aluminum, gold, silver, tantalum nitride, titanium nitride, and tungsten. These can be deposited by sputter deposition, vapor deposition, or other methods known in the art.

Organic barrier layers can include polymeric or small molecule organic materials. Preferred polymer materials for forming an organic barrier layer include parylene materials, which can be deposited from a vapor phase to provide a polymer layer having a relatively small number of defects, excellent adhesion to, and step coverage over, topological features of the OLED devices.

This invention can be used in so-called stacked device architecture, for example, as taught in U.S. Pat. Nos. 5,703,436 and 6,337,492, and U.S. Patent Application Publication 2003/0152801 A1.

EXAMPLES

The invention and its advantages can be better appreciated by the following inventive and comparative examples.

Example 1 (Comparative)

A comparative OLED device was constructed in the following manner:
1. A clean glass substrate was vacuum-deposited with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 130 nm layer of 4,4'-bis[N-(1-naphthyl)-N-phenylamino]biphenyl (NPB) as a hole-transporting layer (HTL);
4. A 21.2 nm layer of 20 nm NPB and 1.2 nm rubrene was vacuum-deposited onto the substrate at a coating station that included a heated graphite boat source to form a yellow light-emitting layer (yellow LEL);
5. A coating of 25 nm of 2-tert-butyl-9,10-bis(2-naphthyl)anthracene (TBADN) with 6% 4-(di-p-tolylamino)-4'-[(di-p-tolylamino)styryl]stilbene was evaporatively deposited on the above substrate to form a blue light-emitting layer (blue LEL);
6. A 35 nm layer of tris(8-quinolinolato)aluminum (III) (ALQ) was vacuum-deposited onto the substrate at a coating station that included a heated graphite boat source to form a green light-emitting layer that also served as an electron-transporting layer; and
7. A 0.5 nm layer of lithium fluoride was evaporatively deposited onto the substrate, followed by a 100 nm layer of aluminum, to form a cathode layer.
8. The device was then transferred to a dry box for encapsulation.

Example 2 (Comparative)

An OLED device was constructed in the manner described in Example 1, Steps 1–5; Steps 6–9 were as follows:
6. A 10 metal-doped organic layer of tris(8-quinolinolato)aluminum (III) (ALQ) with 1.5% Li was vacuum-deposited onto the substrate at a coating station that included a heated graphite boat source;
7. A 25 nm electron-transporting layer (ETL) of tris(8-quinolinolato)aluminum (III) (ALQ) was vacuum-deposited onto the substrate at a coating station that included a heated graphite boat source;
8. A 0.5 nm layer of lithium fluoride was evaporatively deposited onto the substrate, followed by a 100 nm layer of aluminum, to form a cathode layer; and
9. The device was then transferred to a dry box for encapsulation.

Example 3 (Inventive)

An OLED device was constructed in the manner described in Example 1, Steps 1–5; Steps 6–10 were as follows:
6. A 10 nm layer of tris(8-quinolinolato)aluminum (III) (ALQ) was vacuum-deposited onto the substrate at a coating station that included a heated graphite boat source to form a green light-emitting layer;
7. A 10 nm metal-doped organic layer of tris(8-quinolinolato)-aluminum (III) (ALQ) with 1.5% Li was vacuum-deposited onto the substrate at a coating station that included a heated graphite boat source;
8. A 15 nm electron-transporting layer (ETL) of tris(8-quinolinolato)-aluminum (III) (ALQ) was vacuum-deposited onto the substrate at a coating station that included a heated graphite boat source;
9. A 0.5 nm layer of lithium fluoride was evaporatively deposited onto the substrate, followed by a 100 nm layer of aluminum, to form a cathode layer; and
10. The device was then transferred to a dry box for encapsulation.

Example 4 (Inventive)

An OLED device was constructed in the manner described in Example 1, Steps 1–5; Steps 6–10 were as follows:
6. A 20 nm layer of tris(8-quinolinolato)aluminum (III) (ALQ) was vacuum-deposited onto the substrate at a coating station that included a heated graphite boat source to form a green light-emitting layer;

7. A 10 nm metal-doped organic layer of tris(8-quinolinolato)-aluminum (III) (ALQ) with 1.5% Li was vacuum-deposited onto the substrate at a coating station that included a heated graphite boat source;
8. A 5 nm electron-transporting layer (ETL) of tris(8-quinolinolato)-aluminum (III) (ALQ) was vacuum-deposited onto the substrate at a coating station that included a heated graphite boat source;
9. A 0.5 nm layer of lithium fluoride was evaporatively deposited onto the substrate, followed by a 100 nm layer of aluminum, to form a cathode layer; and
10. The device was then transferred to a dry box for encapsulation.

Example 5 (Comparative)

An OLED device was constructed in the manner described in Example 1, Steps 1–5; Steps 6–8 were as follows:
6. A 35 nm metal-doped organic layer of tris(8-quinolinolato)-aluminum (III) (ALQ) with 1.5% Li was vacuum-deposited onto the substrate at a coating station that included a heated graphite boat source;
7. A 100 nm layer of aluminum was evaporatively deposited onto the substrate to form a cathode layer; and
8. The device was then transferred to a dry box for encapsulation.

Example 6 (Inventive)

An OLED device was constructed in the manner described in Example 1, Steps 1–5; Steps 6–9 were as follows:
6. A 10 nm layer of tris(8-quinolinolato)aluminum (III) (ALQ) was vacuum-deposited onto the substrate at a coating station that included a heated graphite boat source to form a green light-emitting layer;
7. A 25 nm metal-doped organic layer of tris(8-quinolinolato)-aluminum (III) (ALQ) with 1.5% Li was vacuum-deposited onto the substrate at a coating station that included a heated graphite boat source;
8. A 100 nm layer of aluminum was evaporatively deposited onto the substrate to form a cathode layer; and
9. The device was then transferred to a dry box for encapsulation.

Results (Examples 1–6)

The devices were tested by applying a current across the electrodes of 20 mA/cm$^2$ and measuring the spectrum. The relative luminous efficiency is defined as the luminous efficiency of the example device, in cd/A, divided by the luminous efficiency in, cd/A, of reference Example 1. The relative power consumption is defined as the power consumption of the example device, in watts (W), divided by the power consumption, in W, of reference Example 1. The power consumption was calculated, in W, for a full-color display showing D65 white at 120 cd/m$^2$. The following table shows the results.

TABLE 1

| Example | Relative Drive Voltage | Change in CIE x from Example 1 | Change in CIE y from Example 1 | Relative Luminous Efficiency | Relative Power Consumption |
| --- | --- | --- | --- | --- | --- |
| 1 (Comparative) | 1.00 | 0.00 | 0.00 | 1.00 | 1.00 |
| 2 (Comparative) | 0.86 | −0.01 | −0.02 | 0.85 | 0.80 |
| 3 (Inventive) | 0.75 | 0.01 | −0.01 | 1.09 | 0.53 |
| 4 (Inventive) | 0.77 | 0.00 | −0.01 | 1.06 | 0.58 |
| 5 (Comparative) | 0.71 | −0.01 | −0.02 | 0.81 | 0.73 |
| 6 (Inventive) | 0.66 | 0.02 | 0.00 | 1.08 | 0.51 |

The data in Table 1 show that, when a metal-doped organic layer is disposed in contact with the blue light-emitting layer as shown in Comparative Examples 2 and 5, there is inadequate green emission as shown by the shift in CIEy value. The Alq doped with Li metal does not emit enough green light. Although the metal-doped organic layer provides improved drive voltage versus Comparative Example 1, the relative luminous efficiency drops.

As shown in Table 1, the inventive devices of this invention have a green light-emitting Alq layer in contact with the blue light-emitting layer and a metal-doped organic layer provided over this green light-emitting Alq. This permits for significantly reduced drive voltage, while maintaining significant green light emission. This invention provides effective luminance efficiency and improved power consumption relative to the comparative examples. Providing this metal-doped organic layer between two layers of Alq also provided improved power consumption. The color of light emission can be changed by selecting the location of the metal-doped organic layer.

Example 7 (Comparative)

A comparative OLED device was constructed in the following manner:
1. A clean glass substrate was vacuum-deposited with indium tin oxide (ITO) to form a transparent electrode of 85 nm thickness;
2. The above-prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 240 nm layer of 4,4'-bis[N-(1-naphthyl)-N-phenylamino]biphenyl (NPB) as a hole-transporting layer (HTL);
4. A 28 nm layer of 20 nm NPB and 8 nm rubrene containing 0.5% (TPDBP) was vacuum-deposited onto the substrate at a coating station that included a heated graphite boat source to form a yellow light-emitting layer (yellow LEL);

5. A coating of 20 nm of 2-tert-butyl-9,10-bis(2-naphthyl) anthracene (TBADN) with 13% NPB and 2.6% 4-(di-p-tolylamino)-4'-[(di-p-tolylamino)-styryl]stilbene was evaporatively deposited on the above substrate to form a blue light-emitting layer (blue LEL);
6. A 40 nm electron-transporting layer (ETL) of tris(8-quinolinolato)-aluminum (III) (ALQ) was vacuum-deposited onto the substrate at a coating station that included a heated graphite boat source;
7. A 0.5 nm layer of lithium fluoride was evaporatively deposited onto the substrate, followed by a 100 nm layer of aluminum, to form a cathode layer; and
8. The device was then transferred to a dry box for encapsulation.

Example 8 (Inventive)

An OLED device was constructed in the manner described in Example 7, Steps 1–5; Steps 6–9 were as follows:
6. A 5 nm electron-transporting layer (ETL) of tris(8-quinolinolato)-aluminum (III) (ALQ) was vacuum-deposited onto the substrate at a coating station that included a heated graphite boat source;
7. A 35 nm electron-transporting layer (ETL) of tris(8-quinolinolato)aluminum (III) (ALQ) with 1.5% Li was vacuum-deposited onto the substrate at a coating station that included a heated graphite boat source;
8. A 0.5 nm layer of lithium fluoride was evaporatively deposited onto the substrate, followed by a 100 nm layer of aluminum, to form a cathode layer; and
9. The device was then transferred to a dry box for encapsulation.

Example 9 (Inventive)

An OLED device was constructed in the manner described in Example 7, Steps 1–5; Steps 6–9 were as follows:
6. A 10 nm electron-transporting layer (ETL) of tris(8-quinolinolato)-aluminum (III) (ALQ) was vacuum-deposited onto the substrate at a coating station that included a heated graphite boat source;
7. A 30 nm electron-transporting layer (ETL) of tris(8-quinolinolato)-aluminum (III) (ALQ) with 1.5% Li was vacuum-deposited onto the substrate at a coating station that included a heated graphite boat source;
8. A 0.5 nm layer of lithium fluoride was evaporatively deposited onto the substrate, followed by a 100 nm layer of aluminum, to form a cathode layer; and
9. The device was then transferred to a dry box for encapsulation.

Example 10 (Inventive)

An OLED device was constructed in the manner described in Example 7, Steps 1–5; Steps 6–9 were as follows:
6. A 20 nm electron-transporting layer (ETL) of tris(8-quinolinolato)aluminum (III) (ALQ) was vacuum-deposited onto the substrate at a coating station that included a heated graphite boat source;
7. A 20 nm electron-transporting layer (ETL) of tris(8-quinolinolato)aluminum (III) (ALQ) with 1.5% Li was vacuum-deposited onto the substrate at a coating station that included a heated graphite boat source;
8. A 0.5 nm layer of lithium fluoride was evaporatively deposited onto the substrate, followed by a 100 nm layer of aluminum, to form a cathode layer; and
9. The device was then transferred to a dry box for encapsulation.

Results (Examples 7–10)

The devices were tested by applying a current across the electrodes of 20 ma/cm$^2$ and measuring the spectrum. The relative luminous efficiency is defined as the luminous efficiency of the example device, in cd/A, divided by the luminous efficiency in, cd/A, of reference Example 7. The relative power consumption is defined as the power consumption of the example device, in watts (W), divided by the power consumption, in W, of reference Example 7. The power consumption was calculated, in W, for a full-color display showing D65 white at 120 cd/m$^2$. The following table shows the results.

TABLE 2

| Example | Relative Drive Voltage | Change in CIE x from Example 7 | Change in CIE y from Example 7 | Relative Luminous Efficiency | Relative Power Consumption |
| --- | --- | --- | --- | --- | --- |
| 7 (Comparative) | 1.00 | 0.00 | 0.00 | 1.00 | 1.00 |
| 8 (Inventive) | 0.81 | 0.00 | 0.00 | 1.23 | 0.69 |
| 9 (Inventive) | 0.81 | −0.01 | 0.01 | 1.27 | 0.65 |
| 10 (Inventive) | 0.82 | −0.01 | 0.01 | 1.16 | 0.73 |

The data in Table 2 show that the metal-doped organic layer provides improved performance when it is separated from the interface between the blue- and green-emitting layers in a range of from about 5 to 20 nm, with optimum performance at about 10 nm. That is, the thickness of the green light-emitting layer should be in a range of from about 5 to 20 nm to give improved power consumption and maintain effective color. Although the preferred green light-emitting layer thickness range is from about 5 to 20 nm, it is believed that a thickness of up to about 50 nm would still provide improved power consumption and effective color.

The invention has been described in detail with particular reference to certain preferred embodiments thereof, but it will be understood that variations and modifications can be effected within the spirit and scope of the invention.

Parts List

100 OLED device
120 substrate 130 anode
135 hole-injecting layer
140 hole-transporting layer
145 first light-emitting layer
150 second-light-emitting layer
160 electron-transporting layer
180 cathode
200 OLED device
220 substrate
230 anode
245 first light-emitting layer
250 second light-emitting layer
262 metal-doped organic layer
280 cathode
300 OLED device
320 substrate
330 anode
335 hole-injecting layer
340 hole-transporting layer
345 first light-emitting layer
350 second light-emitting layer
355 third light-emitting layer
362 metal-doped organic layer
380 cathode
400 OLED device
420 substrate
425a red color filter
425b green color filter
425c blue color filter
430a anode for red light-emitting subpixel
430b anode for green light-emitting subpixel
430c anode for blue light-emitting subpixel
480 cathode

The invention claimed is:

1. An OLED device comprising:
   a) an anode;
   b) a first light-emitting layer disposed over the anode;
   c) a second light-emitting layer disposed over the first light-emitting layer;
   d) a metal-doped organic layer containing an organic electron-transporting material and a low work function metal disposed over the second light-emitting layer; and
   e) a cathode disposed over the metal-doped organic layer.

2. The OLED device of claim 1 wherein the low work function metal is Li, Na, K, Rb, Cs, Mg, Ca, Sr, Ba, La, Ce, Pr, Nd, Sm, Eu, Gd, Tb, Dy, Ho, Er, Tm, Yb, Lu, Y, or Mn.

3. The OLED device of claim 1 wherein the second light-emitting layer includes a metal oxinoid material.

4. The OLED device of claim 1 wherein the metal-doped organic layer is disposed in contact with the second light-emitting layer.

5. An OLED device comprising:
   a) an anode;
   b) a first light-emitting layer disposed over the anode;
   c) a second light-emitting layer disposed in contact with the first light-emitting layer;
   d) a metal-doped organic layer containing an organic electron-transporting material and a low work function metal disposed over the second light-emitting layer, wherein the metal-doped organic layer is spaced in a range of from 5 to 50 nm from the interface between the first and second light-emitting layers; and
   e) a cathode disposed over the metal-doped organic layer.

6. The OLED device of claim 5 wherein the low work function metal is Li, Na, K, Rb, Cs, Mg, Ca, Sr, Ba, La, Ce, Pr, Nd, Sm, Eu, Gd, Tb, Dy, Ho, Er, Tm, Yb, Lu, Y, or Mn.

7. The OLED device of claim 5 wherein the second light-emitting layer includes a metal oxinoid material.

8. The OLED device of claim 5 wherein the metal-doped organic layer is spaced in a range of from 5 to 20 nm from the interface between the first and second light-emitting layers.

9. The OLED device of claim 5 wherein the metal-doped organic layer is disposed in contact with the second light-emitting layer.

10. An OLED device comprising:
    a) an anode;
    b) a first light-emitting layer disposed over the anode;
    c) a second light-emitting layer disposed on the first light-emitting layer;
    d) a metal-doped organic layer containing an organic electron transporting material and a low-work function metal disposed over the second light-emitting layer, wherein the distance between the metal-doped organic layer and the interface between the first and second light-emitting layers is selected to achieve a desired color; and
    e) a cathode disposed over the metal-doped organic layer.

11. The OLED device of claim 10 wherein the low work function metal is Li, Na, K, Rb, Cs, Mg, Ca, Sr, Ba, La, Ce, Pr, Nd, Sm, Eu, Gd, Tb, Dy, Ho, Er, Tm, Yb, Lu, Y, or Mn.

12. The OLED device of claim 10 wherein the second light-emitting layer includes a metal oxinoid material.

13. The OLED device of claim 10 wherein the metal-doped organic layer is spaced in a range of from 5 to 20 nm from the interface between the first and second light-emitting layers.

14. The OLED device of claim 10 wherein the metal-doped organic layer is disposed in contact with the second light-emitting layer.

15. A white light-emitting OLED device comprising:
    a) an anode;
    b) a first light-emitting layer disposed over the anode;
    c) a second light-emitting layer disposed in contact with the first light-emitting layer;
    d) a third light-emitting layer disposed in contact with the second light-emitting layer;
    e) a metal-doped organic layer containing an organic electron transporting material and a low work function metal disposed over the third light-emitting layer, wherein the metal-doped organic layer is spaced in a range of from 5 to 50 nm from the interface between the second and third light-emitting layers; and
    f) a cathode disposed over the metal-doped organic layer, thereby emitting white light.

16. The OLED device of claim 15 wherein the low work function metal is Li, Na, K, Rb, Cs, Mg, Ca, Sr, Ba, La, Ce, Pr, Nd, Sm, Eu, Gd, Tb, Dy, Ho, Er, Tm, Yb, Lu, Y, or Mn.

17. The OLED device of claim 15 wherein the third light-emitting layer includes a metal oxinoid material.

18. The OLED device of claim 15 wherein the metal-doped organic layer is spaced in a range of from 5 to 20 nm from the interface between the second and third light-emitting layers.

19. The OLED device of claim 15 wherein the metal-doped organic layer is disposed in contact with the third light-emitting layer.

20. The OLED device of claim 15 including a color filter array.

21. A white light-emitting OLED device comprising:
a) an anode;
b) a first light-emitting layer disposed over the anode;
c) a second light-emitting layer disposed in contact with the first light-emitting layer;
d) a third light-emitting layer disposed in contact with the second light-emitting layer;
e) a metal-doped organic layer containing an organic electron transporting material and a low work function metal disposed over the third light-emitting layer, wherein the distance between the metal-doped organic layer and the interface between the second and third light-emitting layers is selected in order to produce the desired white light; and
f) a cathode disposed over the metal-doped organic layer.

22. The OLED device of claim 21 wherein the low work function metal is Li, Na, K, Rb, Cs, Mg, Ca, Sr, Ba, La, Ce, Pr, Nd, Sm, Eu, Gd, Tb, Dy, Ho, Er, Tm, Yb, Lu, Y, or Mn.

23. The OLED device of claim 21 wherein the third light-emitting layer includes a metal oxinoid material.

24. The OLED device of claim 21 wherein the metal-doped organic layer includes a metal oxinoid material.

25. The OLED device of claim 21 wherein the metal-doped organic layer is disposed in contact with the third light-emitting layer.

26. The OLED device of claim 21 including a color filter array.

27. A white light-emitting OLED device comprising:
a) an anode;
b) a first light-emitting layer disposed over the anode, wherein the first light-emitting layer contains a hole-transporting material and a light-emitting material that emits light in the yellow to red portion of the spectrum;
c) a second light-emitting layer disposed on the first light-emitting layer, wherein the second light-emitting layer contains a blue to blue-green light-emitting material that emits light in the blue to blue-green portions of the spectrum;
d) a third light-emitting layer on the second light-emitting layer, wherein the third light-emitting layer contains an electron transporting material and has a thickness in a range of from 5 to 20 nm;
e) a metal-doped organic layer containing an organic electron transporting material and a low-work function metal, disposed in contact with the third light-emitting layer; and
f) a cathode disposed over the metal-doped organic layer.

28. The OLED device of claim 27 wherein the low work function metal is Li, Na, K, Rb, Cs, Mg, Ca, Sr, Ba, La, Ce, Pr, Nd, Sm, Eu, Gd, Tb, Dy, Ho, Er, Tm, Yb, Lu, Y, or Mn.

29. The OLED device of claim 27 wherein the third light-emitting layer includes a metal oxinoid material.

30. The OLED device of claim 27 wherein the metal-doped organic layer includes a metal oxinoid material.

31. The OLED device of claim 27 wherein the first light-emitting layer includes a material, or includes materials selected from

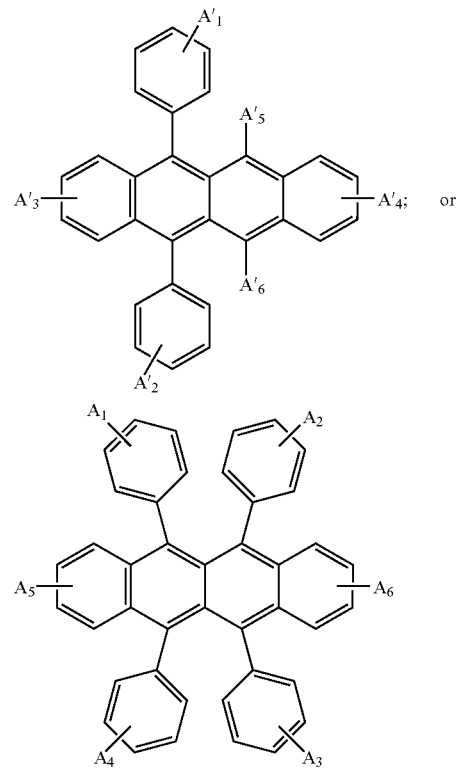

wherein $A_1$–$A_6$ represent one or more substituents on each ring and where each substituent is individually selected from one of the following:
Category 1: hydrogen, or alkyl of from 1 to 24 carbon atoms;
Category 2: aryl or substituted aryl of from 5 to 20 carbon atoms;
Category 3: hydrocarbon containing 4 to 24 carbon atoms, completing a fused aromatic ring or ring system;
Category 4: heteroaryl or substituted heteroaryl of from 5 to 24 carbon atoms including thiazolyl, furyl, thienyl, pyridyl, quinolinyl or other heterocyclic systems, which are bonded via a single bond, or complete a fused heteroaromatic ring system;
Category 5: alkoxylamino, alkylamino, or arylamino of from 1 to 24 carbon atoms; or
Category 6: fluoro, chloro, bromo or cyano;

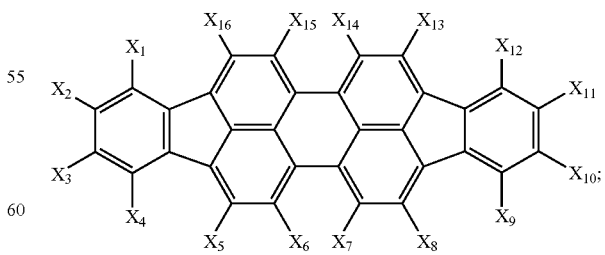

wherein:
$X_1$–$X_{16}$ are independently selected as hydro or substituents that provide red, yellow, or orange luminescence; or

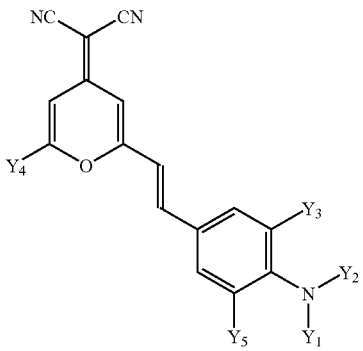

wherein:
- $Y_1$–$Y_5$ represent one or more groups independently selected from hydro, alkyl, substituted alkyl, aryl, or substituted aryl; and
- $Y_1$–$Y_5$ independently include acyclic groups or are joined pairwise to form one or more fused rings, provided that Y3 and Y5 do not together form a fused ring.

32. The OLED device of claim 27 wherein one or both of the second and third light-emitting layers includes an anthracene derivative as a host material.

33. The OLED device of claim 32 wherein the anthracene derivative is selected from

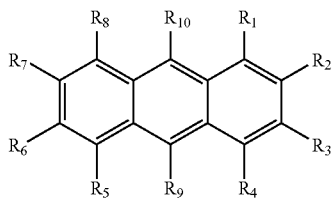

wherein:
- $R_1$–$R_8$ are H;
- $R_9$ is not the same as $R_{10}$;
- wherein $R_9$ is a naphthyl group having no fused rings with aliphatic carbon ring members;
- $R_{10}$ is a biphenyl group having no fused rings with aliphatic carbon ring members; and
- $R_9$ and $R_{10}$ are free of amines and sulfur compounds; or

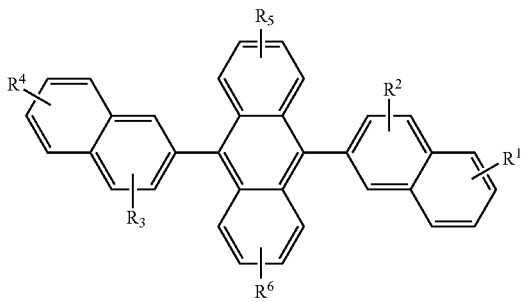

wherein $R^1$, $R^2$, $R^3$, $R^4$, $R^5$, and $R^6$ represent one or more substituents on each ring and each substituent is individually selected from the following groups:

Group 1: hydrogen, or alkyl of from 1 to 24 carbon atoms;

Group 2: aryl or substituted aryl of from 5 to 20 carbon atoms;

Group 3: carbon atoms from 4 to 24 necessary to complete a fused aromatic ring of anthracenyl, pyrenyl, or perylenyl;

Group 4: heteroaryl or substituted heteroaryl of from 5 to 24 carbon atoms as necessary to complete a fused heteroaromatic ring of furyl, thienyl, pyridyl, quinolinyl or other heterocyclic systems;

Group 5: alkoxylamino, alkylamino, or arylamino of from 1 to 24 carbon atoms; and Group 6: fluorine, chlorine, bromine or cyano.

34. The OLED device of claim 27 wherein the second light-emitting layer includes a blue light-emitting dopant selected from the group consisting of
i) a compound of the structure

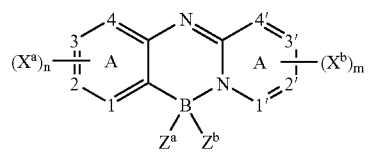

wherein:
- A and A' represent independent azine ring systems corresponding to 6-membered aromatic ring systems containing at least one nitrogen;
- $(X^a)_n$ and $(X^b)_m$ represent one or more independently selected substituents and include acyclic substituents or are joined to form a ring fused to A or A';
- m and n are independently 0 to 4;
- $Z^a$ and $Z^b$ are independently selected substituents;
- 1, 2, 3, 4, 1', 2', 3', and 4' are independently selected as either carbon or nitrogen atoms; and
- that $X^a$, $X^b$, $Z^a$, and $Z^b$, 1, 2, 3, 4, 1', 2', 3', and 4' are selected to provide blue luminescence; and ii) a derivative of a distyrylbenzene or a distyrylbiphenyl that has one or more aryl amine substituents or perylene or a derivative of perylene.

35. The OLED device of claim 27 wherein the third light-emitting layer includes a green light-emitting dopant that is a quinacridone or a coumarin derivative.

36. The OLED device of claim 27 wherein one of the light-emitting layers includes a triplet emitter.

37. The OLED device of claim 27 including a color filter array.

* * * * *